(12) United States Patent
Lin et al.

(10) Patent No.: US 12,322,658 B2
(45) Date of Patent: Jun. 3, 2025

(54) DUMMY FIN WITH REDUCED HEIGHT AND METHOD FORMING SAME

(71) Applicant: Taiwan Semiconductor Manufacturing Co., Ltd., Hsinchu (TW)

(72) Inventors: Shih-Yao Lin, New Taipei (TW); Te-Yung Liu, Hsinchu (TW); Chih-Han Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/402,245

(22) Filed: Jan. 2, 2024

(65) Prior Publication Data

US 2024/0186186 A1    Jun. 6, 2024

Related U.S. Application Data

(63) Continuation of application No. 17/809,953, filed on Jun. 30, 2022, now Pat. No. 11,894,274, which is a continuation of application No. 16/942,076, filed on Jul. 29, 2020, now Pat. No. 11,410,886.

(60) Provisional application No. 63/010,855, filed on Apr. 16, 2020.

(51) Int. Cl.
    *H01L 21/8234* (2006.01)
    *H01L 27/088* (2006.01)
    *H01L 27/092* (2006.01)

(52) U.S. Cl.
    CPC ........... *H01L 21/823431* (2013.01); *H01L 21/823418* (2013.01); *H01L 27/0886* (2013.01); *H01L 27/0924* (2013.01)

(58) Field of Classification Search
    CPC ..... H01L 21/823431; H01L 21/823418; H01L 27/0886; H01L 27/0924
    See application file for complete search history.

(56) References Cited

U.S. PATENT DOCUMENTS

| 11,742,415 B2 | 8/2023 | Ching et al. |
| 2016/0225674 A1 | 8/2016 | Jacob |
| 2017/0140992 A1 | 5/2017 | Chang et al. |
| 2017/0338323 A1* | 11/2017 | Cheng ............... H01L 29/161 |
| 2018/0053824 A1 | 2/2018 | Wang et al. |

(Continued)

FOREIGN PATENT DOCUMENTS

| CN | 106711142 A | 5/2017 |
| CN | 109427870 A | 3/2019 |

(Continued)

*Primary Examiner* — Christine A Enad
(74) *Attorney, Agent, or Firm* — Slater Matsil, LLP

(57) ABSTRACT

A method includes forming a first protruding semiconductor fin and a dummy fin protruding higher than top surfaces of isolation regions. The first protruding semiconductor fin is parallel to the dummy fin, forming a gate stack on a first portion of the first protruding semiconductor fin and a second portion of the dummy fin. The method further includes recessing a third portion of the first protruding semiconductor fin to form a recess, recessing an fourth portion of the dummy fin to reduce a height of the fourth portion of the dummy fin, and forming an epitaxy semiconductor region in the recess. The epitaxy semiconductor region is grown toward the dummy fin.

20 Claims, 23 Drawing Sheets

(56) References Cited

U.S. PATENT DOCUMENTS

| | | |
|---|---|---|
| 2019/0067444 A1 | 2/2019 | Ching et al. |
| 2019/0067445 A1* | 2/2019 | Ching .................. H01L 29/785 |
| 2019/0326287 A1* | 10/2019 | Liaw .................. H01L 27/0207 |
| 2019/0334014 A1 | 10/2019 | Ching et al. |
| 2020/0020794 A1 | 1/2020 | Lin et al. |
| 2020/0075423 A1* | 3/2020 | Kwok ............. H01L 21/823481 |
| 2020/0091142 A1 | 3/2020 | Ching et al. |
| 2020/0098753 A1 | 3/2020 | Dewey et al. |
| 2020/0098888 A1* | 3/2020 | Lin .................... H01L 27/0886 |
| 2021/0126109 A1 | 4/2021 | Lin et al. |
| 2022/0059685 A1 | 2/2022 | Wang et al. |

FOREIGN PATENT DOCUMENTS

| | | |
|---|---|---|
| CN | 110729244 A | 1/2020 |
| CN | 110783267 A | 2/2020 |
| CN | 110875253 A | 3/2020 |

\* cited by examiner

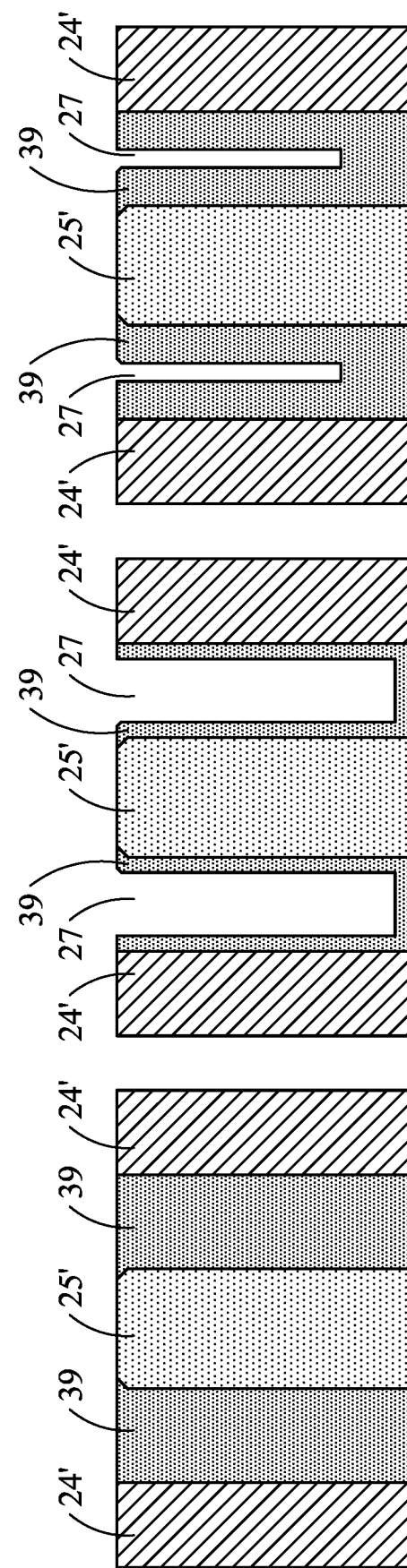

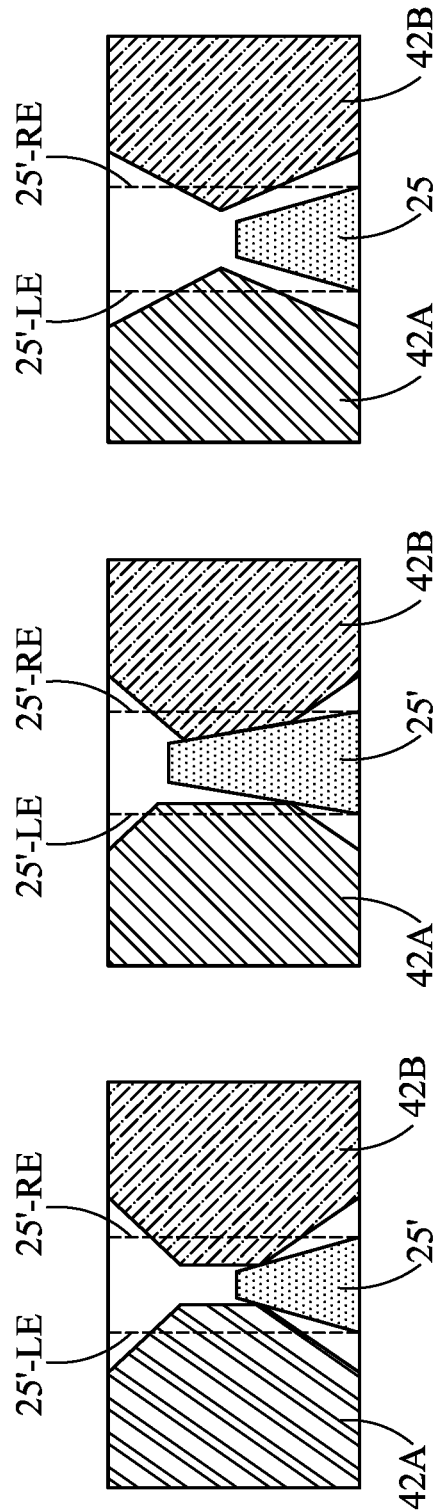

DUMMY FIN WITH REDUCED HEIGHT AND METHOD FORMING SAME

PRIORITY CLAIM AND CROSS-REFERENCE

This application is a continuation of U.S. patent application Ser. No. 17/809,953, entitled "Dummy Fin with Reduced Height and Method Forming Same", and filed Jun. 30, 2022, which is a continuation of U.S. patent application Ser. No. 16/942,076, entitled "Dummy Fin with Reduced Height and Method Forming Same," and filed Jul. 29, 2020, which claims the benefit of the U.S. Provisional No. 63/010,855, filed on Apr. 16, 2020, and entitled "Epitaxy Process Window Enlargement Through Epitaxy-Region Control Method," which applications are hereby incorporated herein by reference.

BACKGROUND

Metal-Oxide-Semiconductor (MOS) devices are basic building elements in integrated circuits. A MOS device may have a gate electrode formed of polysilicon doped with p-type or n-type impurities, which are doped using doping processes such as ion implantation or thermal diffusion. The work function of the gate electrode may be adjusted to the band-edge of silicon. For an n-type Metal-Oxide-Semiconductor (NMOS) device, the work function may be adjusted to close to the conduction band of silicon. For a P-type Metal-Oxide-Semiconductor (PMOS) device, the work function may be adjusted to close to the valence band of silicon. Adjusting the work function of the polysilicon gate electrode can be achieved by selecting appropriate impurities.

MOS devices with polysilicon gate electrodes exhibit carrier depletion effect, which is also known as a poly depletion effect. The poly depletion effect occurs when the applied electrical fields sweep away carriers from gate regions close to gate dielectrics, forming depletion layers. In an n-doped polysilicon layer, the depletion layer includes ionized non-mobile donor sites, wherein in a p-doped polysilicon layer, the depletion layer includes ionized non-mobile acceptor sites. The depletion effect results in an increase in the effective gate dielectric thickness, making it more difficult for an inversion layer to be created at the surface of the semiconductor.

The poly depletion problem may be solved by forming metal gate electrodes, wherein the metallic gates used in NMOS devices and PMOS devices may also have band-edge work functions. Accordingly, the resulting metal gates include a plurality of layers to meet the requirements of the NMOS devices and PMOS devices.

The formation of metal gates typically involves forming dummy gate dielectrics and dummy gate electrodes, removing the dummy gate dielectrics and the dummy gate electrodes to form trenches, depositing high-k dielectric layers and metal layers into the trenches, and performing a Chemical Mechanical Polish (CMP) process to remove excess portions of the high-k dielectric layer and the metal layers. The remaining portions of the metal layers form metal gates.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1, 2, 3A, 3B-1, 3B-2, 3B-3, 4A, 4B-1, 4B-2, 4B-3, 4B-4, 4B-5, 5A, 5B-1, 5B-2, 5B-3, 6, 7A, 7B, 8, 9A, 9B, 9C, 9D, 10A, 10B, 10C, 10D, 11A, and 11B illustrate the perspective views and cross-sectional views of intermediate stages in the formation of Fin Field-Effect Transistors (FinFETs) with source/drain regions separated by dummy fins in accordance with some embodiments.

DETAILED DESCRIPTION

Figure 1:
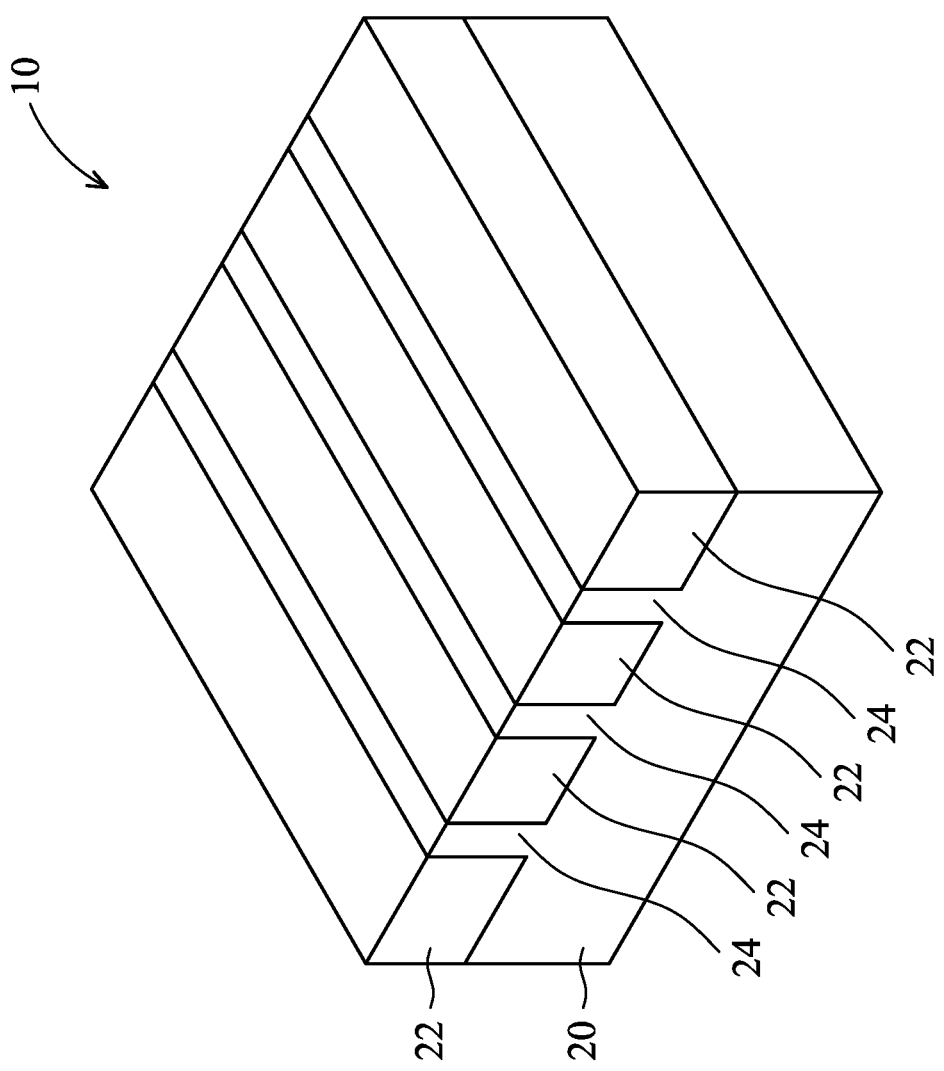

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) with source/drain regions separated from each other by a dummy fin(s) and the methods of forming the same are provided in accordance with some embodiments. The dummy fin(s) is partially recessed and narrowed. The intermediate stages of forming the transistors are illustrated in accordance with some embodiments. Some variations of some embodiments are discussed. Throughout the various views and illustrative embodiments, like reference numbers are used to designate like elements. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

Figure 19:
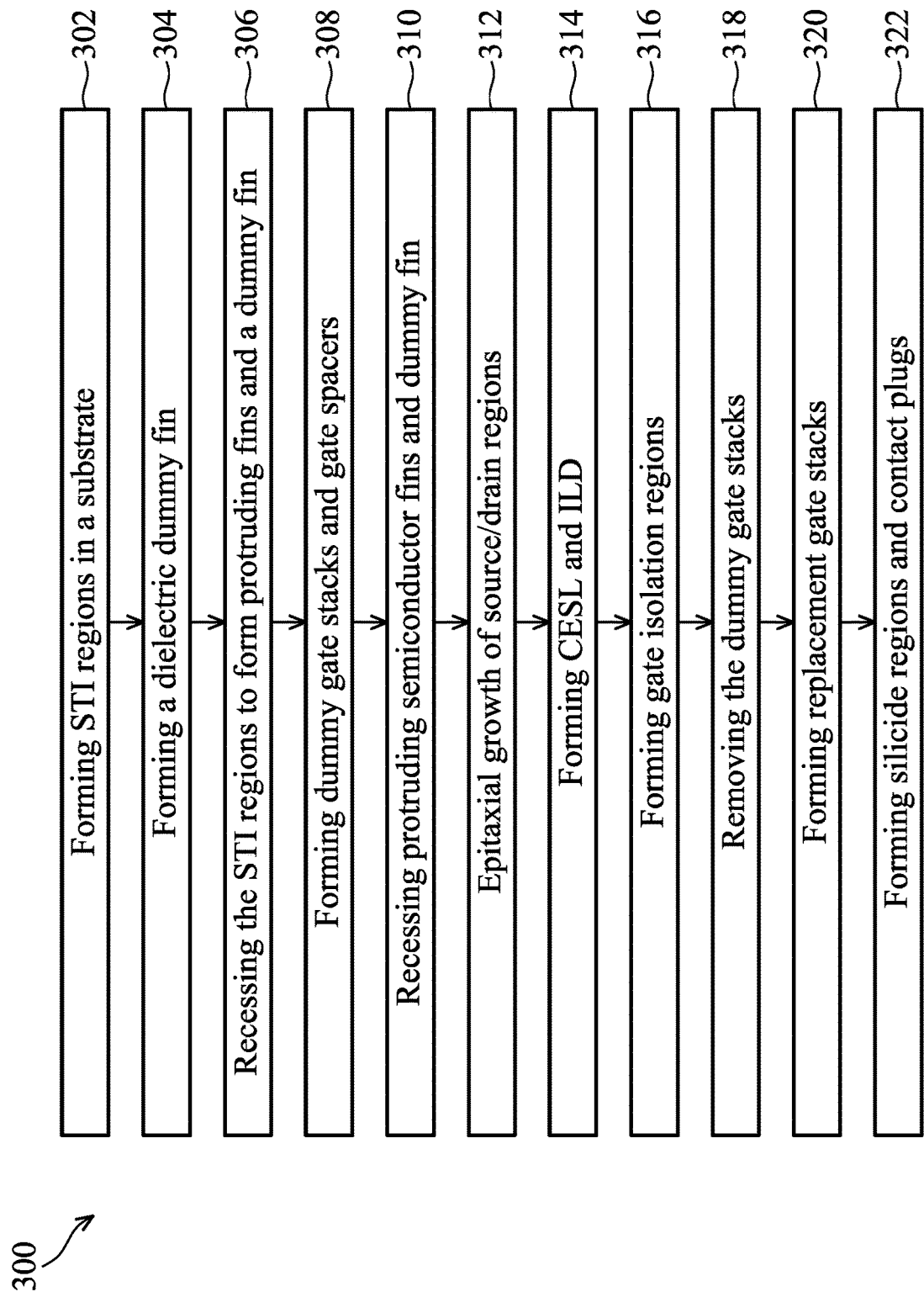
FIG. 19 illustrates a process flow for forming FinFETs with source/drain regions separated by dummy fin in accordance with some embodiments.

FIGS. 1, 2, 3A, 3B-1, 3B-2, 3B-3, 4A, 4B-1, 4B-2, 4B-3, 4B-4, 4B-5, 5A, 5B-1, 5B-2, 5B-3, 6, 7A, 7B, 8, 9A, 9B, 9C, 9D, 10A, 10B, 10C, 10D, 11A, and 11B illustrate the cross-sectional views and perspective views of intermediate stages in the formation of FinFETs and corresponding dummy fins in accordance with some embodiments of the present disclosure. The processes shown in these Figures are also reflected schematically in the process flow 300 as shown in FIG. 19.

FIG. 1 illustrates a perspective view of an initial structure. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. Isolation regions 22 such as Shallow Trench Isolation (STI) regions may be formed to extend from a top surface of substrate 20 into substrate 20. The respective process is illustrated as process 302 in the process flow 300 as shown in FIG. 19. The portions of substrate 20 between neighboring STI regions 22 are referred to as semiconductor strips 24. In accordance with some embodiments of the present disclosure, semiconductor strips 24 are parts of the original substrate 20, and hence the material of semiconductor strips 24 is the same as that of substrate 20. In accordance with alternative embodiments of the present disclosure, semiconductor strips 24 are replacement strips formed by etching the portions of substrate 20 between STI regions 22 to form recesses, and performing an epitaxy process to regrow another semiconductor material in the recesses. Accordingly, semiconductor strips 24 are formed of a semiconductor material different from that of substrate 20. In accordance with some embodiments, semiconductor strips 24 are formed of Si, SiP, carbon-doped silicon, SiPC, SiGe, SiGeB, Ge, or a III-V compound semiconductor such as InP, GaAs, AlAs, InAs, InAlAs, InGaAs, or the like.

STI regions 22 may include a liner oxide (not shown), which may be a thermal oxide formed through the thermal oxidation of a surface layer of substrate 20. The liner oxide may also be a deposited silicon oxide layer formed using, for example, Atomic Layer Deposition (ALD), High-Density Plasma Chemical Vapor Deposition (HDPCVD), Chemical Vapor Deposition (CVD), or the like. STI regions 22 may also include a dielectric material over the liner oxide, wherein the dielectric material may be formed using Flowable Chemical Vapor Deposition (FCVD), spin-on, or the like.

Figure 2:
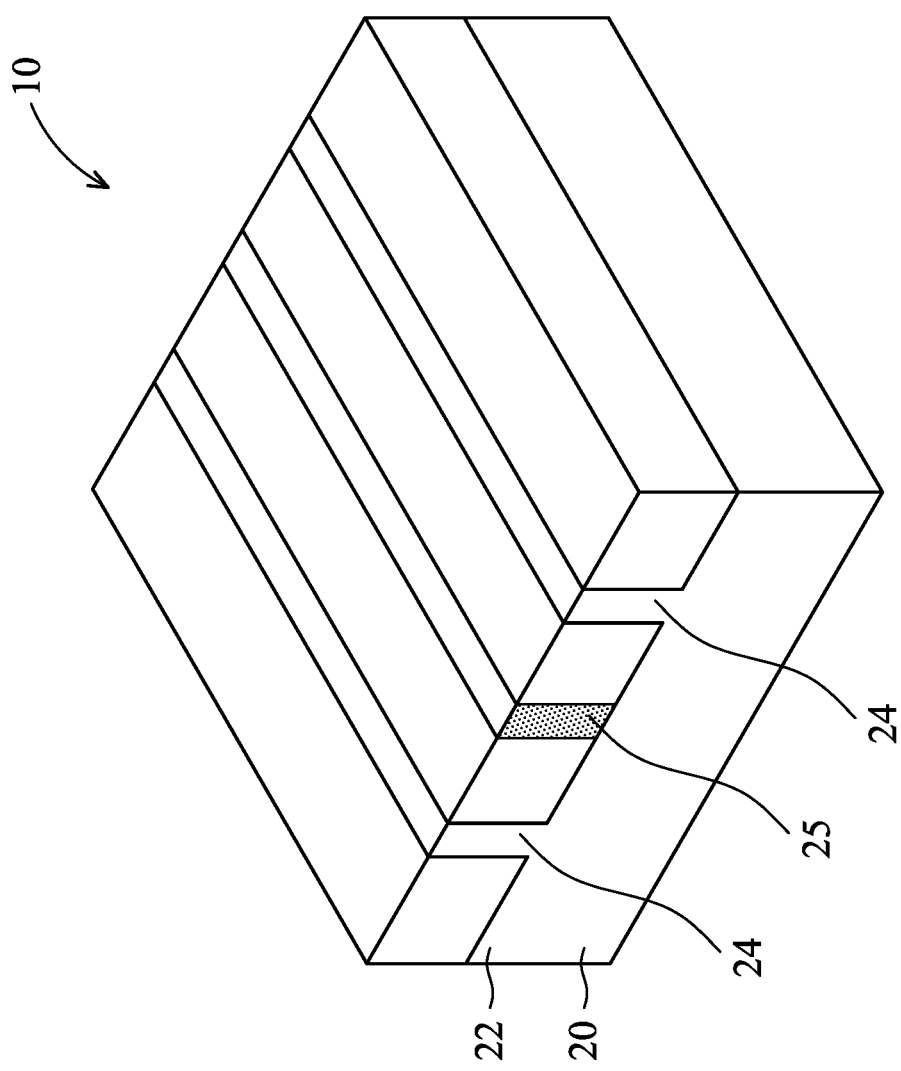

FIG. 2 illustrates the formation of dielectric dummy strip 25. The respective process is illustrated as process 304 in the process flow 300 as shown in FIG. 19. In accordance with some embodiments, dummy strip 25 is formed by etching one of the semiconductor strips 24 to form a recess, and then filling the recessing with a dielectric material. In accordance with other embodiments, dielectric dummy strip 25 may be formed using other methods. The dielectric material of dielectric dummy strip 25 may be formed of a single homogeneous material or may have a composite structure including more than one layers formed of different materials. The material of dielectric dummy strip 25 includes, and is not limited to, $SiO_2$, SiON, $Si_3N_4$, SiCN, SiONC, HfO, TaN, or the like, composite layer thereof, and/or compound thereof. The bottom surface of dielectric dummy strip 25 may be higher than, level with, or lower than, the bottom surfaces of STI regions 22. The top surface of dielectric dummy strip 25 may also be higher than, level with, or lower than, the top surfaces of semiconductor strips 24.

Figure 3A:
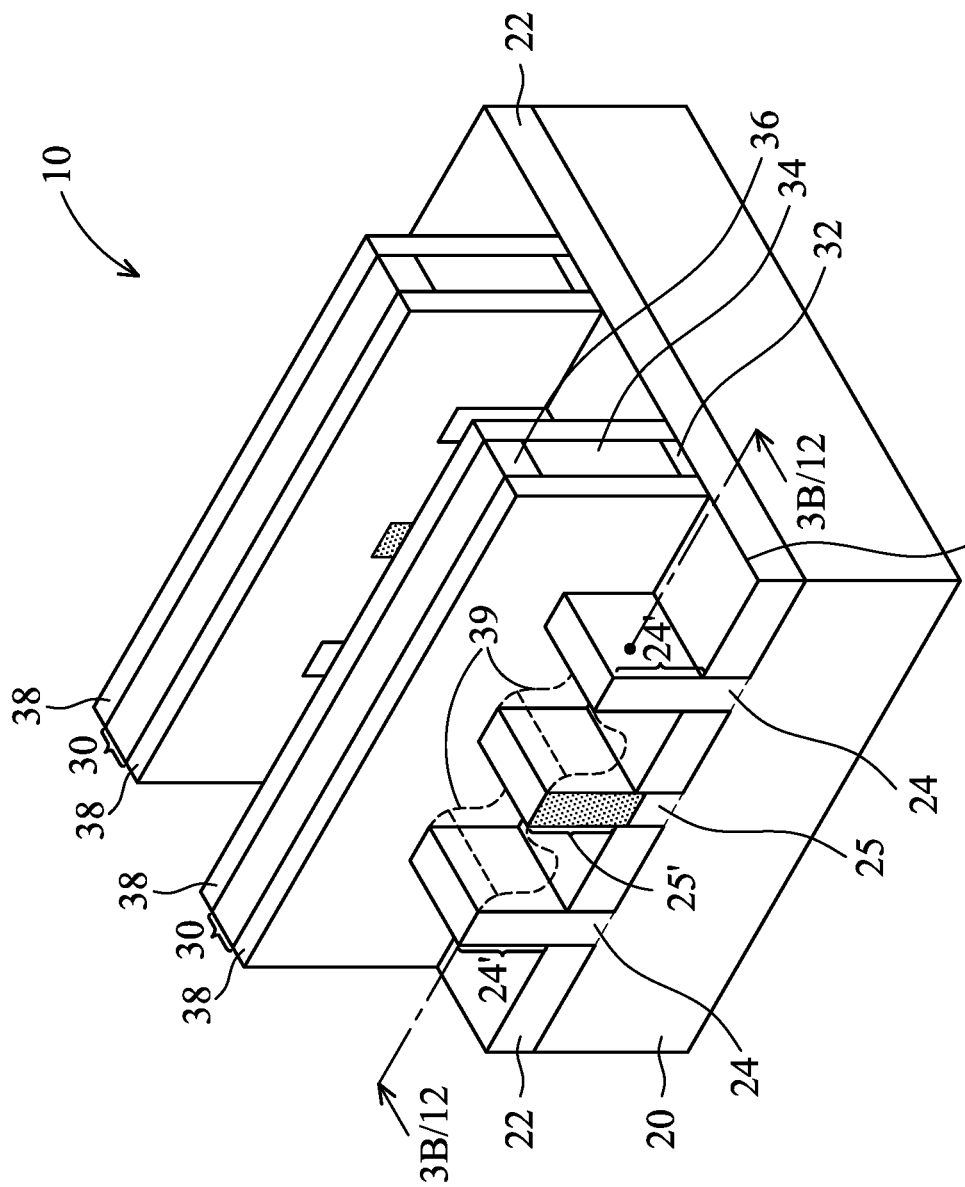

Referring to FIG. 3A, STI regions 22 are recessed. The top portions of semiconductor strips 24 and dielectric dummy strip 25 protrude higher than the top surfaces 22A of the remaining portions of STI regions 22 to form protruding fins 24' and dummy fin 25', respectively. The respective process is illustrated as process 306 in the process flow 300 as shown in FIG. 19. The etching may be performed using a dry etching process, wherein $HF_3$ and $NH_3$ are used as the etching gases. In accordance with alternative embodiments of the present disclosure, the recessing of STI regions 22 is performed using a wet etch process. The etching chemical may include HF solution, for example.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Further referring to FIG. 3A, after the recessing of STI regions 22, dummy gate stacks 30 are formed on the top surfaces and the sidewalls of (protruding) fins 24' and dummy fin 25'. The respective process is illustrated as process 308 in the process flow 300 as shown in FIG. 19. Dummy gate stacks 30 may include dummy gate dielectrics 32 and dummy gate electrodes 34 over dummy gate dielectrics 32. Dummy gate electrodes 34 may be formed, for example, using polysilicon or amorphous silicon, and other materials may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, or multi-layers thereof. Dummy gate stacks 30 may cross over a single one or a plurality of protruding fins 24', dummy fin 25', and/or STI regions 22. Dummy gate stacks 30 also have lengthwise directions perpendicular to the lengthwise directions of protruding fins 24'.

Next, gate spacers 38 are formed on the sidewalls of dummy gate stacks 30. In accordance with some embodiments of the present disclosure, gate spacers 38 are formed of a dielectric material such as $SiO_2$, SION, $Si_3N_4$, SiCN, SiONC, HfO, TaN, or the like, and may have a single-layer structure or a multi-layer structure including a plurality of dielectric layers. The formation process may include depositing a blanket dielectric layer or layers, and then performing an anisotropic etching process to remove the horizontal portions of the blanket dielectric layer(s), and the vertical portions on the sidewalls of gate stack 30 are left as being the gates spacers 38. The blanket dielectric layer may be a conformal layer, using a conformal deposition method such as Atomic Layer deposition (ALD), Chemical Vapor Deposition (CVD), or the like.

In the same processes in which gate spacers 38 are formed, fin spacers 39 may also be formed. FIG. 3A schematically illustrates some examples of fin spacers 39 between neighboring protruding fins 24' and dummy fin 25', wherein fin spacers 39 are formed using dashed lines. The fin spacers 39 on the outer sides of protruding fins 24' are not shown, although fin spacers may also be formed in these places. FIGS. 3B-1, 3B-2, and 3B-3 illustrate some examples of fin spacers 39. The cross-sectional views in FIGS. 3B-1, 3B-2, and 3B-3 are obtained from reference cross-section 3B-3B in FIG. 3A. Referring to FIG. 3B-1, when the gaps between neighboring protruding fin 24' and dummy fin 25' have high aspect ratios and short distances, fin spacers 39 may fully fill the gaps. In the example shown in FIG. 3B-2, significant portions of the gaps 27 are unfilled. In accordance with some embodiments, fin spacers 39 include horizontal portions at the bottoms of gaps 27. In accordance with alternative embodiments, the horizontal portions at the bottoms of gaps 27 may also be removed in the anisotropic etching process. FIG. 3B-3 illustrates fin spacers 39 in accordance with yet alternative embodiments, in which small gaps 27 are left unfilled, while a majority of each of the gaps 27 is filled.

In accordance with some embodiments of the present disclosure, an etching process (referred to as source/drain recessing hereinafter) is performed to etch the portions of protruding fins 24' that are not covered by dummy gate stack 30 and gate spacers 38, resulting in the structure shown in FIG. 4A. At the same time protruding fins 24' are etched, dummy fin 25' may also be etched and recessed, so that its height and width are significantly reduced. The respective process is illustrated as process 310 in the process flow 300 as shown in FIG. 19. The portions of fins 24' directly underlying dummy gate stacks 30 and gate spacers 38 are protected, and are not etched. The top surfaces of the recessed semiconductor strips 24 may be lower than the top surfaces 22A of STI regions 22 in accordance with some embodiments. The spaces left by the etched portions of protruding fins 24' are referred to as recesses 40.

In accordance with some embodiments, the portions 25'A of dummy fin 25', which is not directly underlying gate spacers 38 and dummy gate stacks 30, are partially recessed. Alternatively stated, portions 25'A of dummy fin 25' are reduced in height, and may be (or may not be) narrowed by the etching process. On the other hand, portions 25'B of dummy fin 25', which portions 25'B are directly underlying gate spacers 38 and dummy gate stacks 30, are protected from the etching process, and are not recessed and not narrowed. For example, the remaining height H2 of portions 25'A is smaller than height H1 of portions 25'B. Height H1 of portion 25'B is also the height of portion 25'A before it is recessed. Ratio H2/H1 may be in the range between about 0.1 and about 0.9, and may be in the range between about 0.3 and about 0.7.

In accordance with some embodiments, the recessing of protruding fins 24' and the recessing of dummy fin 25' are performed in the common process for etching protruding fins 24', and the etching chemical for recessing protruding fins 24' is selected, so that both of dummy fin 25' and protruding fins 24' are etched simultaneously. In accordance with alternative embodiments, the recessing of protruding fins 24' and the recessing of dummy fin 25' are performed in different processes. For example, dummy fin 25' may remain to be un-etched when protruding fins 24' are etched, and then dummy fin 25' is etched, for example, in a cleaning process, while in the cleaning process, protruding fins 24' may be etched simultaneously, or may not be etched.

In accordance with some embodiments, the etching process comprises a dry etching process. The etching may be performed using direct plasma or remote plasma. The etching process may also be a radical etching process, wherein the plasma generated from the etching gas is filtered to remove ions, while radicals are left and used for the etching. In accordance with some embodiments, the process gas may include an etching gas, which may include $Cl_2$, HBr, $CF_4$, $CHF_3$, $CH_2F_2$, $CH_3F$, $C_4F_6$, $BCl_3$, $SF_6$, $H_2$, $NF_3$, or combinations thereof. The process gas may also include a passivation gas for tuning etching selectivity $ER_{24'}/ER_{25'}$, which is the ratio of the etching rate $ER_{24'}$ of protruding fins 24' to the etching rate $ER_{25'}$ of dummy fin 25'. The passivation gas may include $N_2$, $O_2$, $CO_2$, $SO_2$, CO, $CH_4$, $SiCl_4$, or combinations thereof. In addition, a dilute gas (carrier gas) such as Ar, He, Ne, or the combinations thereof may also be used. In accordance with some embodiments, the etching is performed with the source power in a range between about 10 watts and about 3,000 watts. The etching may be performed with a bias power, which may be smaller than about 3,000 watts. The pressure of the process gas may be in a range between about 1 mTorr and about 5 Torr, and the process gas flow rate may be in a range between about 1 sccm and about 5,000 sccm. In an example etching process, HBr and/or $Cl_2$ are used as the etching gases, and the etching selectivity $ER_{24'}/ER_{25'}$ may be adjusted by adjusting the flow rate of the passivation gas, wherein increasing the passivation gas will increase the etching selectivity, and verse versa. Also, the etching selectivity $ER_{24'}/ER_{25'}$ may be increased by reducing the bias power, or reduced by increasing the bias power. In another example in which the dummy fin 25' comprises SiN and wet etching is used, adding $H_3PO_4$ may increase etching selectivity. In accordance with some embodiments, the etching selectivity $ER_{24'}/ER_{25'}$ is in a range between about 0.1 \ and about 5. In the embodiments in which etching selectivity $ER_{24'}/ER_{25'}$ is smaller than 1.0, an etch stop layer may be formed on top of dummy fin 25' to protect the underlying portions of dummy fin 25'. With the etch stop layer, although dummy fin 25' may have an etching rate greater than the etching rate of protruding fins 24' (when etching selectivity $ER_{24'}/ER_{25'}$ is smaller than 1.0), after the etching of protruding fins 24', dummy fin 25' may still have a desirable portion left.

In accordance with alternative embodiments, the etching of protruding fins 24' and dummy fin 25' is performed using a wet etching process, wherein the etching chemical may include HF and $F_2$. The etching chemical may also include an assisting etching chemical for tuning the etching selectivity $ER_{24'}/ER_{25'}$, which may include $H_2SO_4$, HCl, HBr, $NH_3$, $H_3PO_4$, or combinations thereof. A solvent including de-ionized water, alcohol, acetone, or the like may be used.

Fin spacers 39 may also be recessed when dummy fin 25' is recessed. FIGS. 4B-1, 4B-2, 4B-3, 4B-4, and 4B-5 illustrate some example profiles of some dummy fins 25' (after the etching process) and the remaining fin spacers 39 (if any left). In FIG. 4B-1, no fin spacer is left after the recessing of fin spacers 39. In FIG. 4B-2, dummy fin 25' has a step, and fin spacers 39 have top surfaces continued from the top surfaces of the steps, and fin spacers 39 may have vertical outer sidewalls. In FIG. 4B-3, dummy fin 25' has steps, and fin spacers 39 have top surfaces continued from the top surface of the steps, with the heights of fin spacers 39 continuously reducing to zero. In FIG. 4B-4, dummy fin 25' has steps, and fin spacers 39 have a U-shaped top surfaces, which may be resulted from the profiles shown in FIGS. 3B-2 and 3B-3. FIG. 4B-5 illustrates a profile, with the lower portions of dummy fin 25' and fin spacers 39 further recessed than shown in FIG. 4B-4.

Figure 5A:
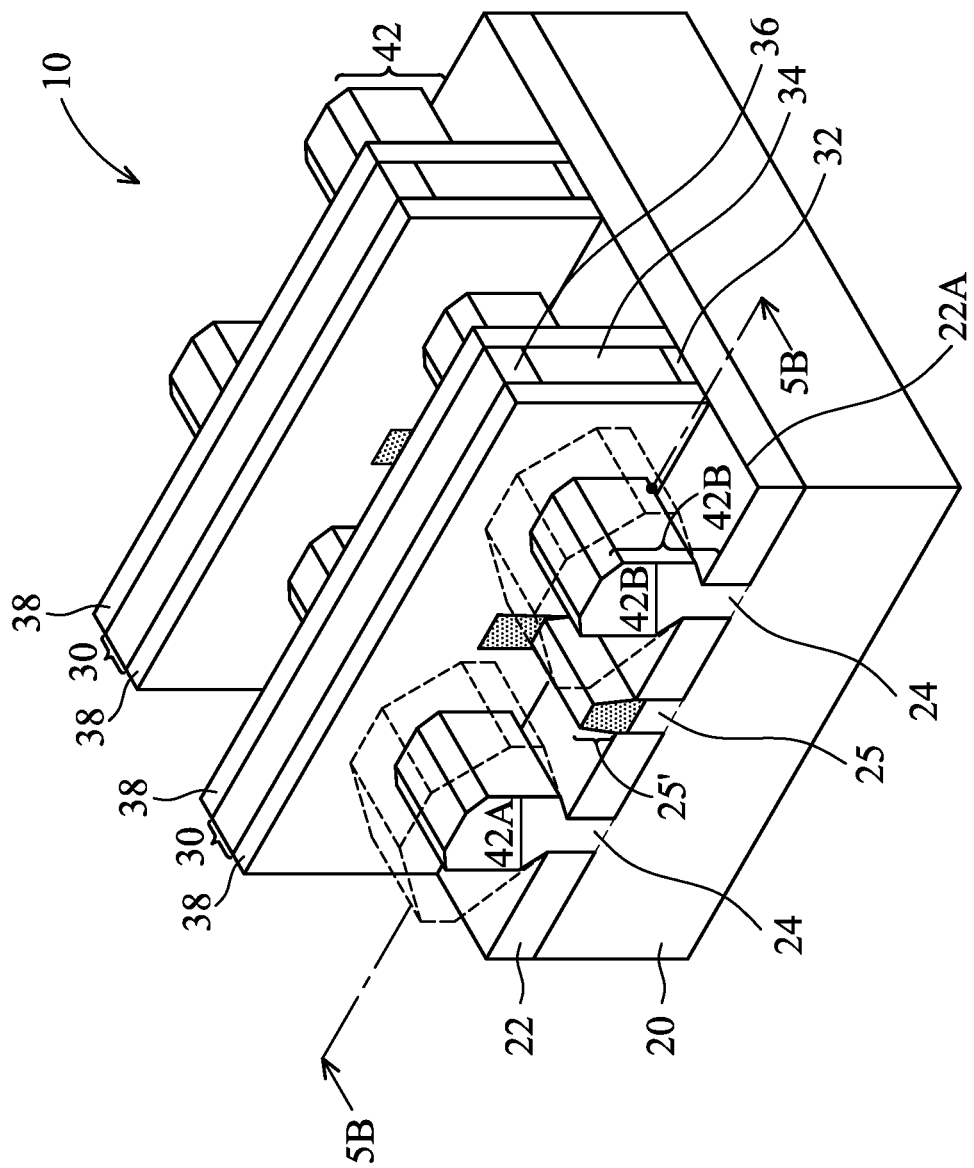

Next, epitaxy regions (source/drain regions) 42A and 42B (collectively referred to as 42) are formed by selectively growing a semiconductor material from recesses 40, and the resulting structure is shown in FIG. 5A. The respective process is illustrated as process 312 in the process flow 300 as shown in FIG. 19. Epitaxy regions 42A and 42B may be of the same conductivity type (p-type or n-type), and may be formed in a common epitaxy process. Alternatively, epitaxy regions 42A and 42B are of opposite conductivity types, and may be epitaxially grown in separate epitaxy processes. In accordance with some embodiments, epitaxy regions 42A and/or 42B include silicon germanium, silicon, silicon carbon, or the like. Depending on whether the resulting FinFET is a p-type FinFET or an n-type FinFET, a p-type or an n-type impurity may be in-situ doped with the proceeding of the epitaxy. For example, when the resulting FinFET is a p-type FinFET, SiB, silicon germanium boron (SiGeB), GeB, or the like may be grown. Conversely, when the resulting FinFET is an n-type FinFET, silicon phosphorous (SiP), silicon carbon phosphorous (SiCP), or the like, may be grown. After epitaxy regions 42A and 42B fully fill recesses 40, epitaxy regions 42 start expanding horizontally, and facets may be formed. In accordance with some embodiments, epitaxy regions 42A and/or 42B are laterally spaced apart from dummy fin 25', as indicated by solid lines. In accordance with alternative embodiments, epitaxy regions 42A and/or 42B are close to or contact dummy fin 25', as shown by dashed lines.

FIGS. 5B-1, 5B-2, and 5B-3 illustrate several cross-sectional views of dummy fin 25' and source/drain regions 42A and 42B in accordance with some embodiments. The cross-sectional views are obtained from the reference cross-section 5B-5B in FIG. 5A. Referring to FIG. 5B-1, source/drain regions 42A and 42B are symmetric relative to dummy fin 25', for example, when source/drain regions 42A and 42B are formed of a same semiconductor material which may be of p-type or n-type. Source/drain regions 42A and 42B are also in contact with the opposing sidewalls of dummy fin 25', and are blocked from contacting with each other by dummy fin 25'. Referring to FIG. 5B-2, source/drain regions 42A and 42B are asymmetric relative to dummy fin 25', for example, when source/drain regions 42A and 42B are formed of different semiconductor materials, with one of p-type and the other of n-type. FIG. 5B-3 illustrates an example, in which source/drain regions 42A and 42B are spaced apart from dummy fin 25'.

In FIGS. 5B-1, 5B-2, and 5B-3, dashed lines 25'-LE and 25'-RE are drawn to represent the left and right edges of dummy fin 25' if dummy fin 25' is not recessed. It is observed that due to the recessing of dummy fin 25', extra spaces are provided by the etched portions of dummy fin 25', and source/drain regions 42A and 42B may extend into the extra spaces to have increased volume. The performance of the resulting FinFETs is thus improved. In addition, the likelihood of the merging (and hence the electrical shorting) of source/drain regions 42A and 42B is not necessarily increased when the recessing of dummy fin 25' is controlled.

Figure 6:
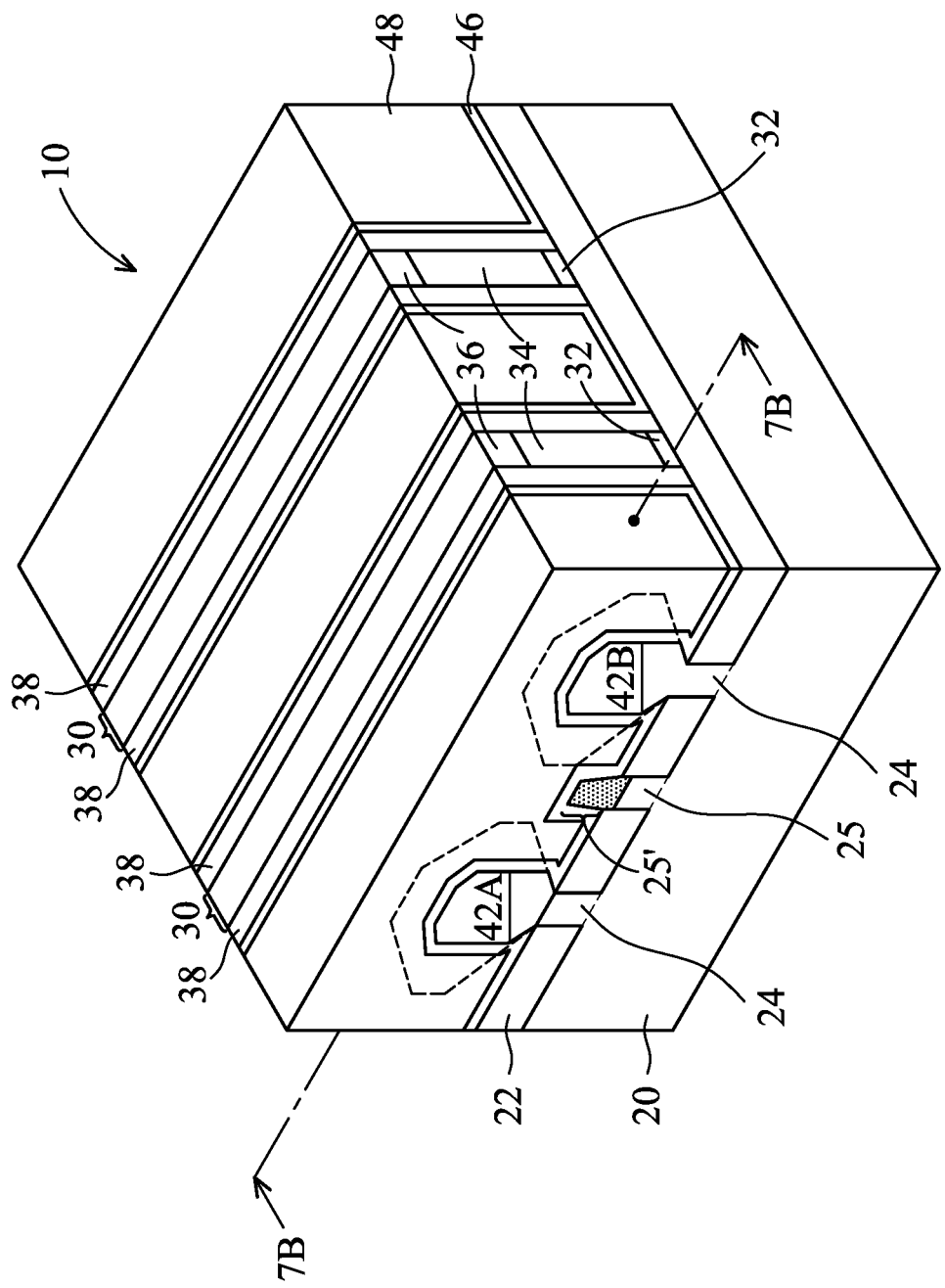

FIG. 6 illustrates a perspective view of the structure after the formation of Contact Etch Stop Layer (CESL) 46 and Inter-Layer Dielectric (ILD) 48. The respective process is illustrated as process 314 in the process flow 300 as shown in FIG. 19. CESL 46 may be formed of silicon nitride, silicon carbo-nitride, or the like. CESL 46 may be formed using a conformal deposition method such as ALD or CVD, for example. ILD 48 may include a dielectric material formed using, for example, FCVD, spin-on coating, CVD, or another deposition method. ILD 48 may also be formed of an oxygen-containing dielectric material, which may be silicon-oxide based such as silicon oxide, Phospho-Silicate Glass (PSG), Boro-Silicate Glass (BSG), Boron-Doped Phospho-Silicate Glass (BPSG), or the like. A planarization process such as Chemical Mechanical Polish (CMP) process or a mechanical grinding process is performed to level the top surfaces of ILD 48, dummy gate stacks 30, and gate spacers 38 with each other.

Figure 7A:
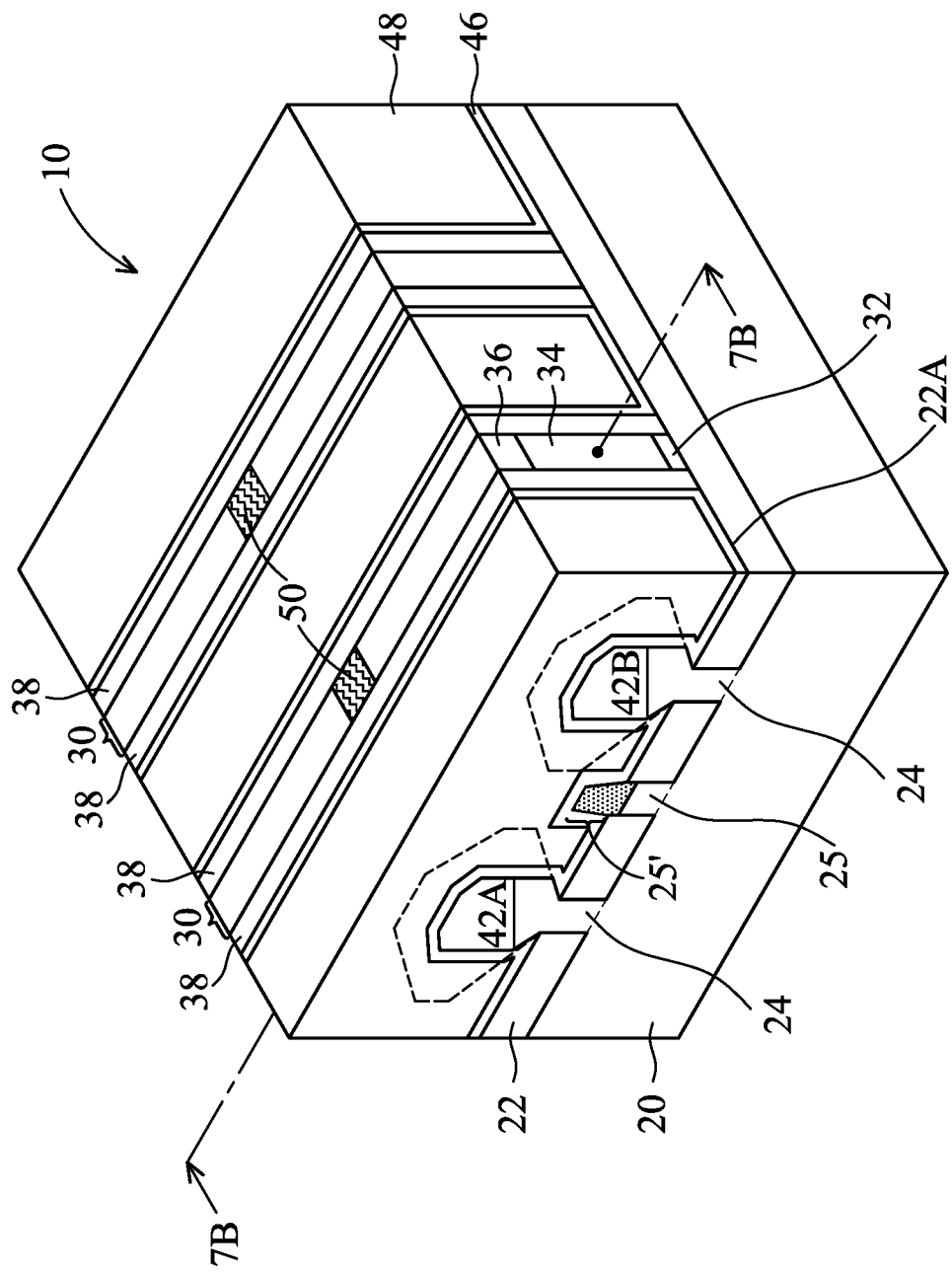
Figure 7B:
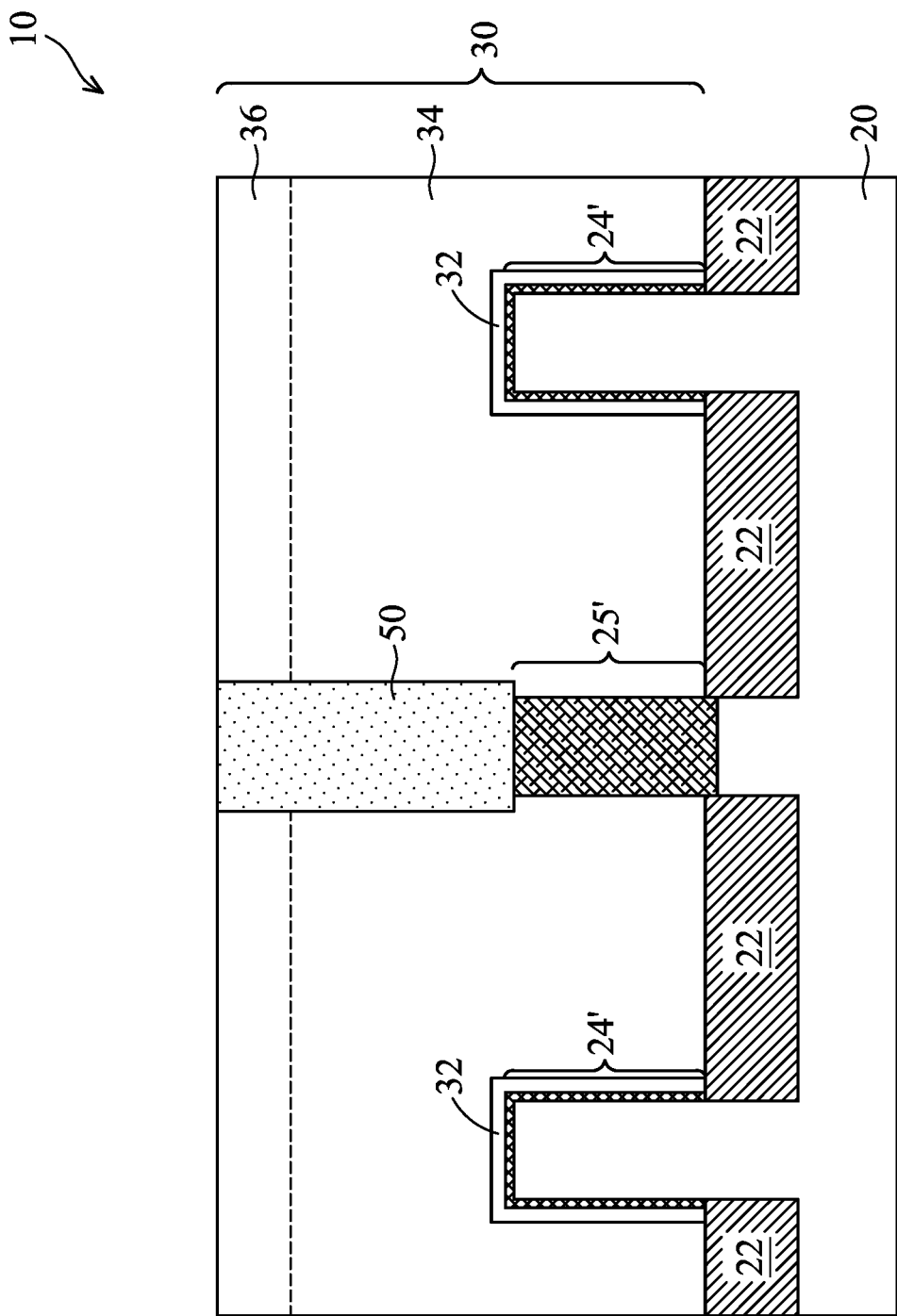

FIGS. 7A and 7B illustrate a perspective view and a cross-sectional view, respectively, in the formation of gate isolation regions 50. The respective process is illustrated as process 316 in the process flow 300 as shown in FIG. 19. FIG. 7B illustrates a reference cross-section 7B-7B in FIG. 7A. The formation process may include etching dummy gate stacks 30 to form openings (occupied by gate isolation regions 50), with the openings separating each of dummy gate stacks 30 into separate portions, as shown in both of FIGS. 7A and 7B. The etching is performed until dummy fin 25' is exposed, as can be realized from FIG. 7B. The openings are then filled with a dielectric material(s) to form gate isolation regions 50.

Figure 8:
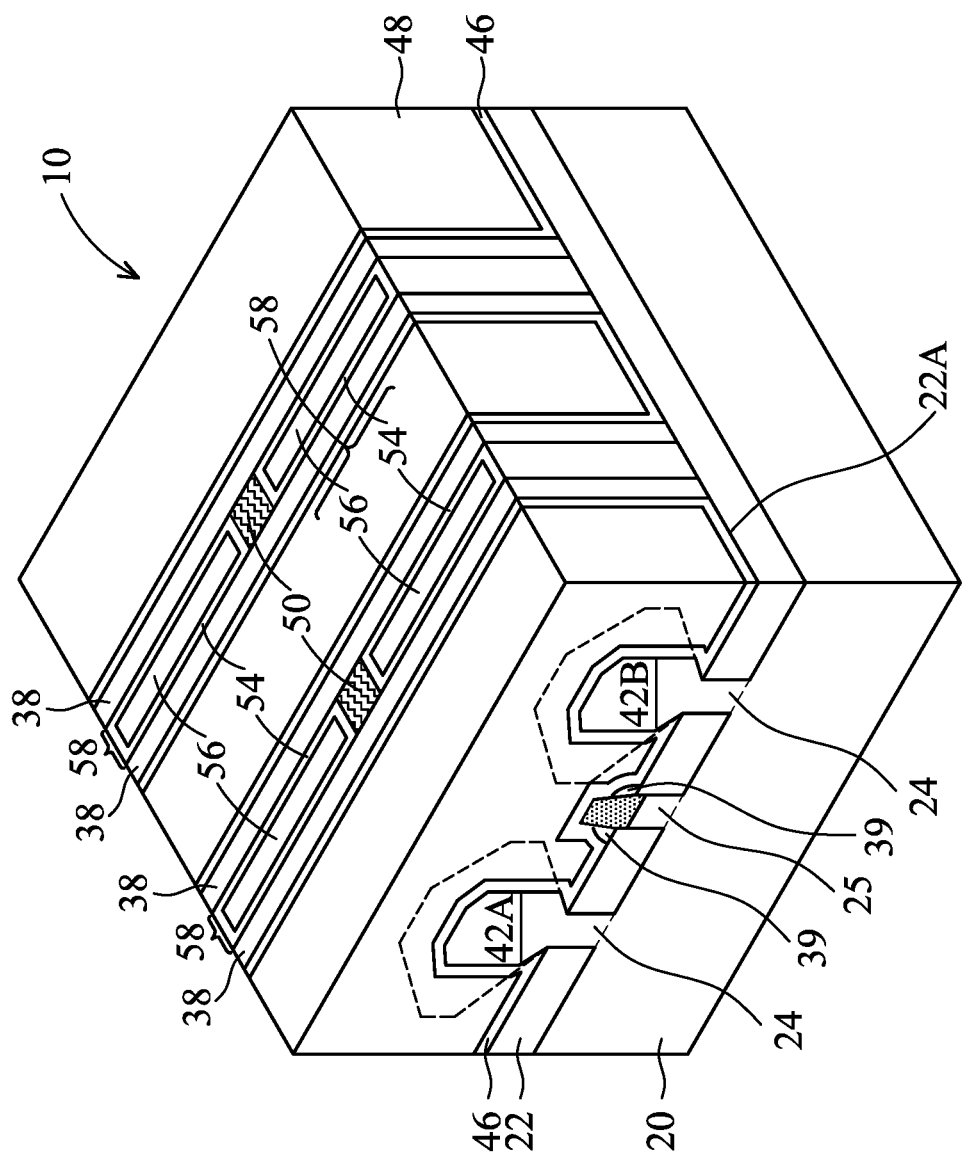

Next, dummy gate stacks 30, which include hard mask layers 36, dummy gate electrodes 34 and dummy gate dielectrics 32, are replaced with replacement gate stacks 58, as shown in FIG. 8. In accordance with some embodiments of the present disclosure, the replacement includes etching hard mask layers 36, dummy gate electrodes 34, and dummy gate dielectrics 32 as shown in FIG. 6 in one or a plurality of etching steps, resulting in openings to be formed between gate spacers 38. The respective process is illustrated as process 318 in the process flow 300 as shown in FIG. 19.

Next, as also shown in FIG. 8, (replacement) gate stacks 58 are formed, which include gate dielectrics 54 and gate electrodes 56. The respective process is illustrated as process 320 in the process flow 300 as shown in FIG. 19. The formation of gate stacks 58 includes forming/depositing a plurality of layers, and then performing a planarization process such as a CMP process or a mechanical grinding process. In accordance with some embodiments of the present disclosure, each of gate dielectrics 54 includes an Interfacial Layer (IL) as its lower part. The IL is formed on the exposed surfaces of protruding fins 24'. The IL may include an oxide layer such as a silicon oxide layer, which is formed through the thermal oxidation of protruding fins 24', a chemical oxidation process, or a deposition process. Each of gate dielectrics 54 may also include a high-k dielectric layer formed over the IL. The high-k dielectric layer may include $HfO_2$, $ZrO_2$, $HfZrO_x$, $HfSiO_x$, HfSiON, $ZrSiO_x$, $HfZrSiO_x$, $Al_2O_3$, $HfAlO_x$, HfAlN, $ZrAlO_x$, $La_2O_3$, $TiO_2$, $Yb_2O_3$, silicon nitride, or the like. The dielectric constant (k-value) of the high-k dielectric material is higher than 3.9, and may be higher than about 7.0. The high-k dielectric layer may be formed as conformal layers, and extends on the sidewalls of protruding fins 24' and the sidewalls of gate spacers 38. Gate dielectrics 54 also extend on the top surfaces and sidewalls of dielectric dummy fin 25'.

The sub-layers in gate electrodes 56 may include, and are not limited to, a Titanium Silicon Nitride (TSN) layer, a tantalum nitride (TaN) layer, a titanium nitride (TiN) layer, a titanium and aluminum containing layer, an additional TiN and/or TaN layer, and a filling metal region. Some of these sub-layers define the work function of the respective FinFET. Furthermore, the metal layers of a p-type FinFET and the metal layers of an n-type FinFET may be different from each other so that the work functions of the metal layers are suitable for the respective p-type or n-type FinFETs. The filling metal may include tungsten, cobalt, or the like.

FIG. 8 further schematically illustrates fin spacers 39 as an example when some of fin spacers 39 are left. In accordance with alternative embodiments, as discussed in preceding paragraphs, fin spacers 39 may be removed.

Figure 9A:
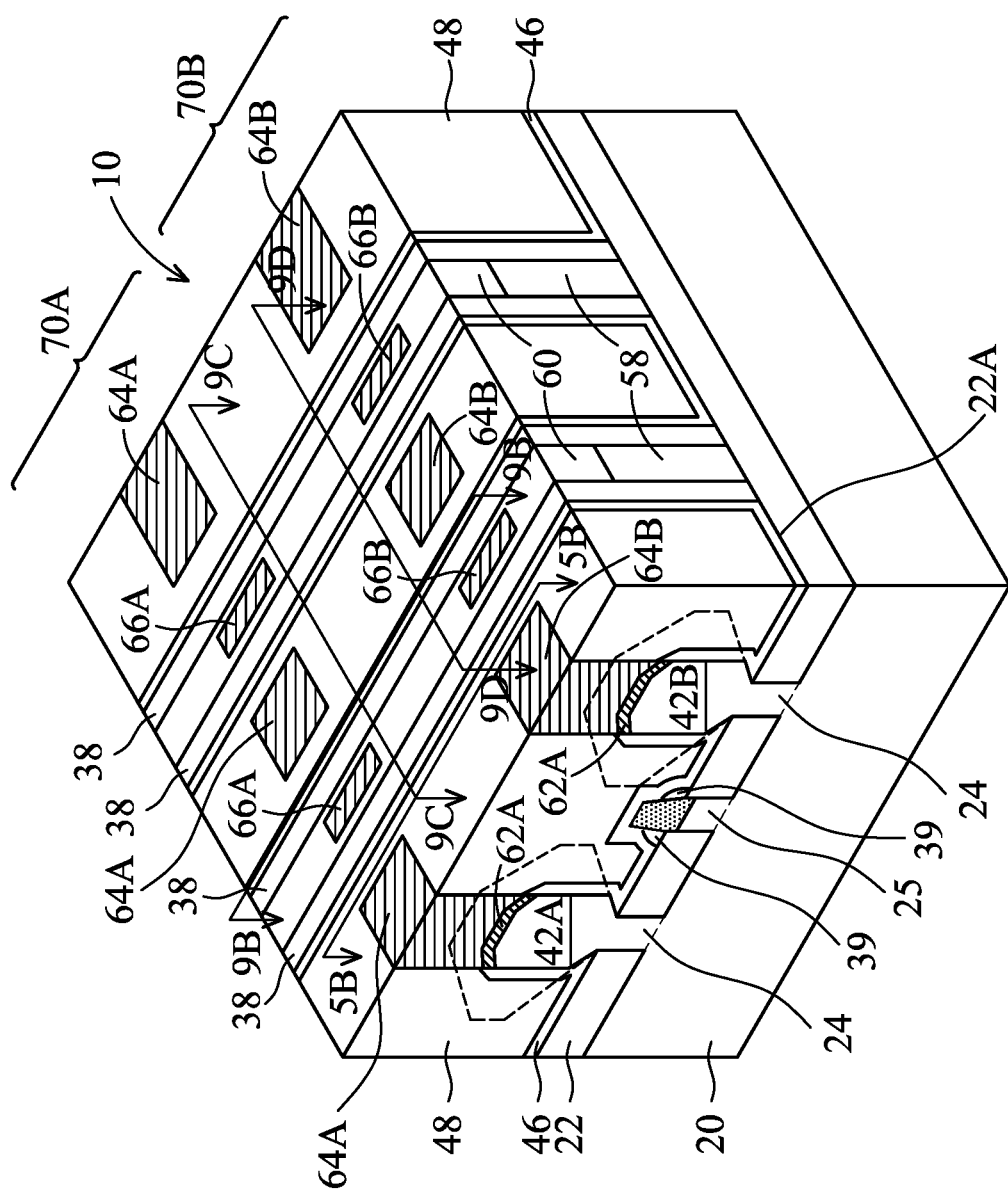
Figure 9B:
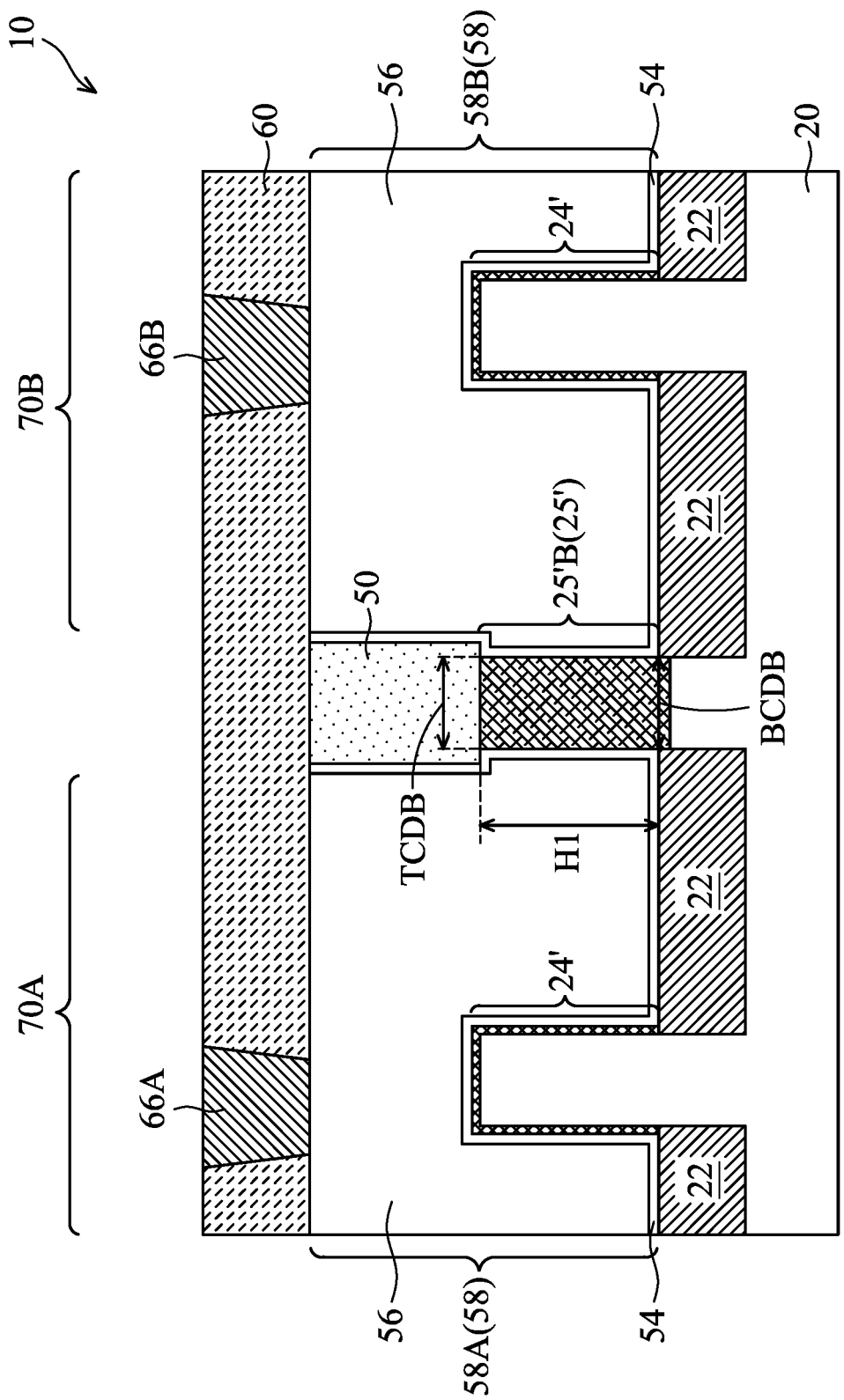

Next, as shown in FIGS. 9A and 9B, hard masks 60 are formed. In accordance with some embodiments of the present disclosure, the formation of hard masks 60 includes recessing gate stacks 58 through etching to form recesses, filling a dielectric material into the recesses, and performing a planarization to remove the excess portions of the dielectric material.

FIGS. 9A and 9B further illustrate the formation of source/drain silicide regions 62A and 62B, source/drain contact plugs 64A and 64B, and gate contact plugs 66A and 66B. The respective process is illustrated as process 322 in the process flow 300 as shown in FIG. 19. FinFETs 70A and 70B are thus formed. In accordance with some embodiments, FinFETs 70A and 70B are both p-type FinFETs or both n-type FinFETs. In accordance with alternative embodiments, FinFETs 70A and 70B include a p-type FinFET and an n-type FinFET.

Figure 9C:
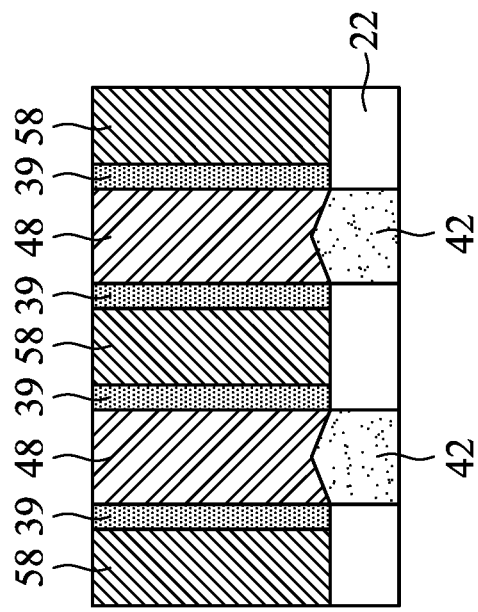
Figure 9D:
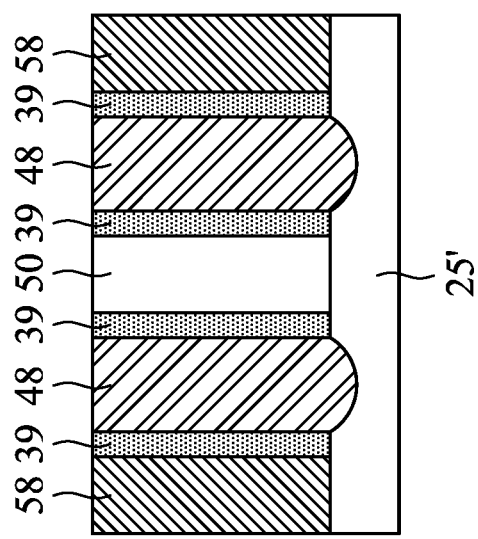

Several cross-sectional views of FIG. 9A are shown in FIGS. 9B, 9C, 9D, and 5B-1, 5B-2, and 5B-3. FIG. 9B illustrates some of the features in the cross-section 9B-9B in FIG. 9A. Replacement gates 58A and 58B (referred to collectively as replacement gate stacks 58) are separated from each other by dummy fin 25' and gate isolation region 50. Gate contact plugs 66A and 66B are over and contacting replacement gate stack 58A and 58B, respectively. FIG. 9C schematically illustrates some of the features in the cross-section 9C-9C in FIG. 9A. FIG. 9D schematically illustrates some of the features in the cross-section 9D-9D in FIG. 9A. Some (but not all) of the features in the cross-section 5B-5B in FIG. 9A may be found in FIGS. 5B-1, 5B-2, and 5B-3.

Figure 4A:
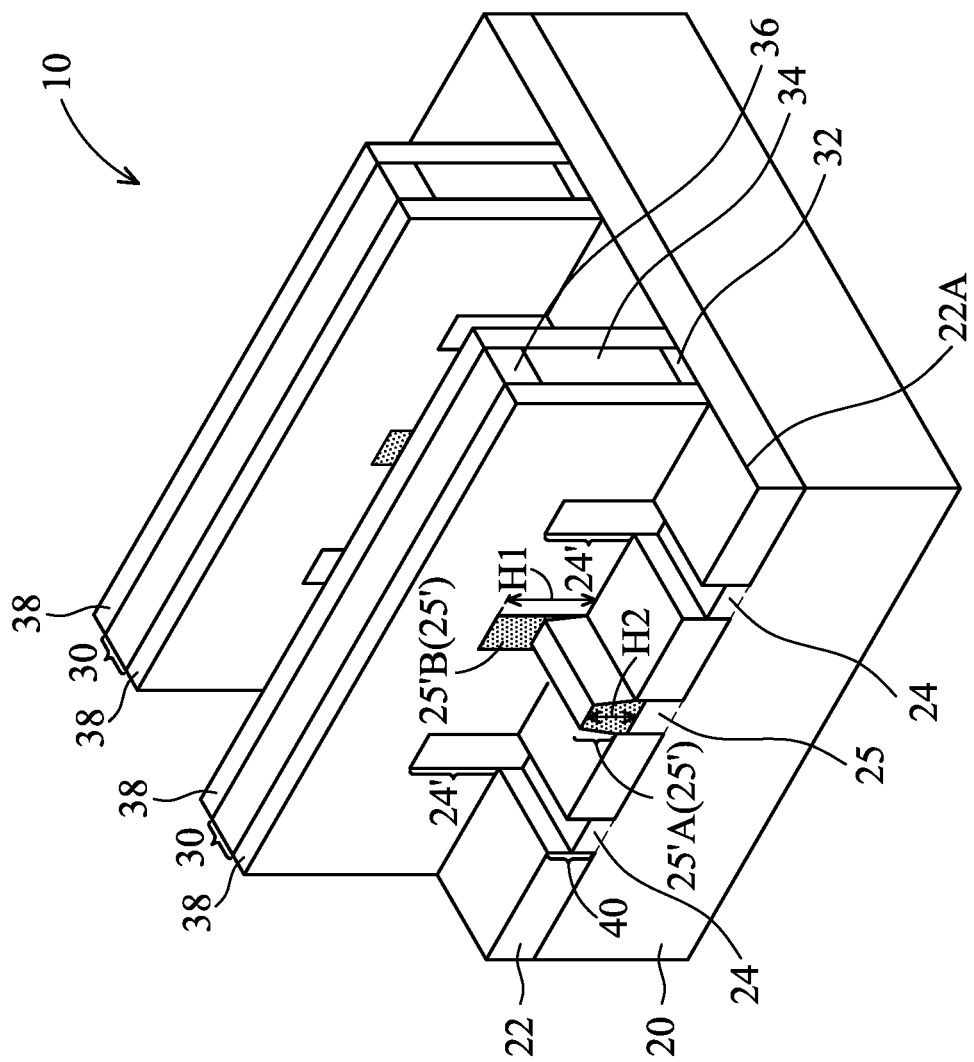
Figures 1, 4B:
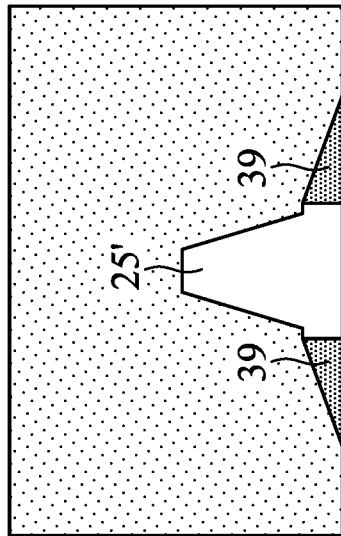
Figures 2, 4B:
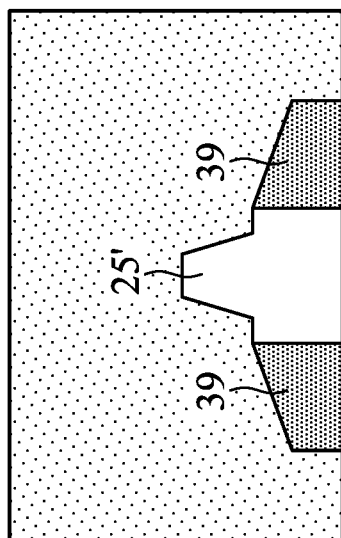
Figures 3, 4B:
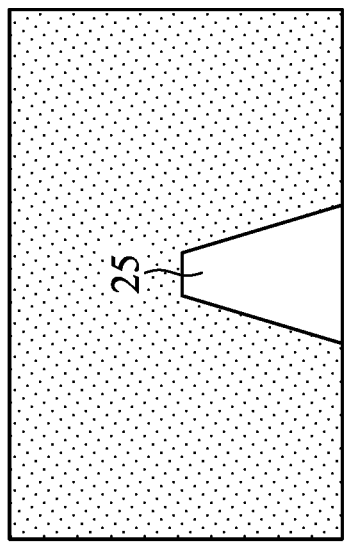
Figures 4, 4B:
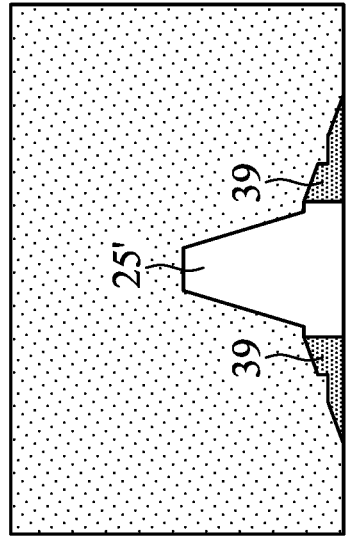
Figures 4, 4B, 5:
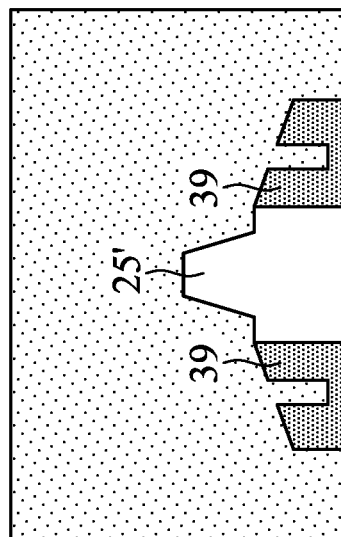
Figure 10A:
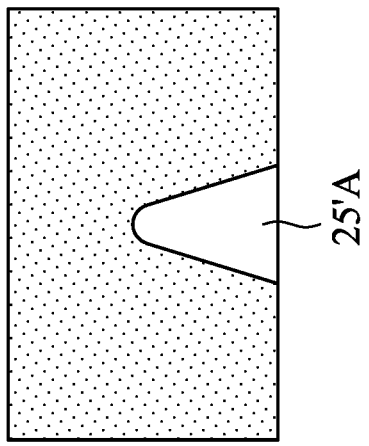
Figure 10B:
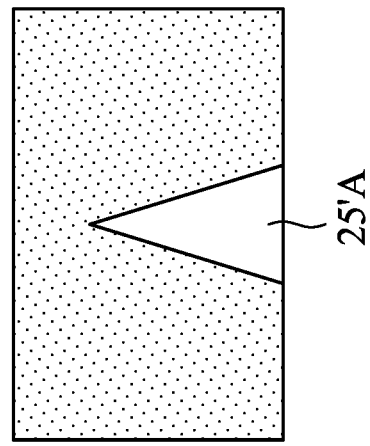
Figure 10C:
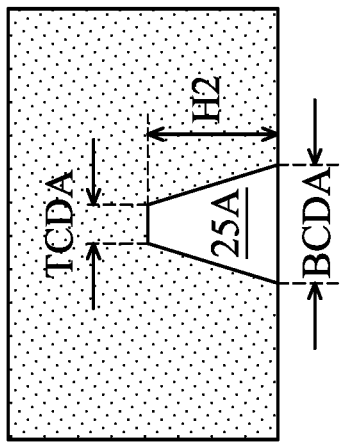
Figure 10D:
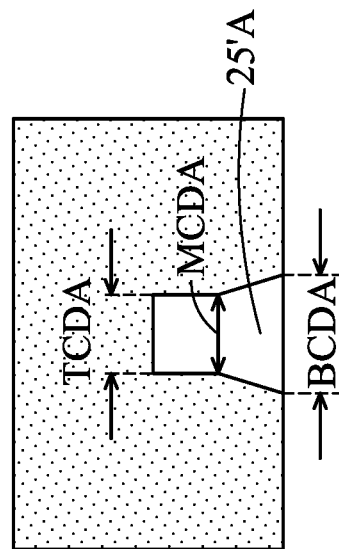

FIGS. 10A, 10B, 10C, and 10D illustrate some example profiles of the portion 25'A of dummy fin 25' in accordance with some embodiments (also refer to FIG. 4A). The profiles are obtained from the portion of dummy fin directly underlying ILD 48 (FIG. 9A). In FIG. 10A, dummy fin 25' has a trapezoidal shape. In FIG. 10B, dummy fin 25' has a tapered profile, with the top end being rounded. In FIG. 10C, dummy fin 25' has a top portion with vertical sidewalls and having a uniform width, and a bottom portion having a trapezoidal shape, wherein top width TCDB is equal to middle width MCDB, and is smaller than bottom width BCDB. In FIG. 10D, dummy fin 25' has a triangular shape.

Some dimensions of the resulting structure are discussed referring to FIGS. 9B and 10A in accordance with some embodiments. Height H1 (FIG. 9B) of dummy fin portion 25'B is selected to be in certain range, and a too-great H1 value may cause the metal gates that are not supposed to be isolated to be isolated, and a too-small H1 value may cause the dummy fin 25' to be fully removed when recessed, and hence defeating the purpose for forming dummy fin 25'. Accordingly, height H1 of dummy fin portion 25'B may be selected as being in the range between about 100 Å and about 3,000 Å. The value of height H2 (FIG. 10A) of dummy fin portion 25'A is selected so that it is great enough to separate neighboring source/drain regions, while small enough to gain extra volume for the source/drain regions. Accordingly, height H2 of dummy fin portion 25'A is smaller than height H1, and may be selected to be in the range between about 30 Å and about 2,100 Å. The difference (H1−H2) may be greater than about 50 Å, and may be in the range between about 50 Å and about 2,100 Å. The top width TCDB and bottom width BCDB (FIG. 9B) of dummy fin portion 25'B may be equal to or substantially equal to each other, for example, with a difference smaller than about 5 percent of bottom width BCDB. On the other hand, the top width TCDA and bottom width BCDA (FIG. 10A) of dummy fin portion 25'A has the relationship (BCDA>TCDA), and the difference (BCDA−TCDA) may be greater than about 5 Å, and may be smaller than 80 percent of bottom width BCDA. Also, there exists the relationship (TCDB>TCDA), and the relationship (BCDA−TCDA)>(BCDB−TCDB). Each of widths TCDA, BCDA, TCDB, and BCDB may also be in the range between about 3 nm and about 1 μm in accordance with some embodiments.

Figure 11B:
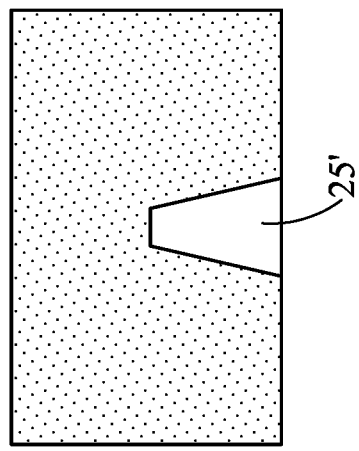
Figure 11A:
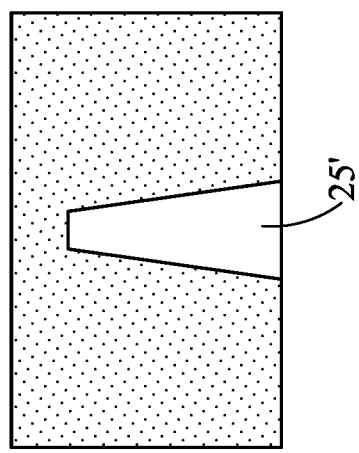

It is appreciated that the dummy fins 25' in different regions of the same device chip and same wafer may have different sizes and/or shapes. For example, FIGS. 11A and 11B illustrate two dummy fins 25' that are in different device regions, and have different heights, different widths, and/or different shapes. The difference in heights, widths, and/or shapes may be achieved by etching the dummy fins 25' in different regions through separate etching processes.

FIGS. 12 through 16 illustrate the cross-sectional views of intermediate stages in the etching of protruding fins 24' and dummy fins 25', and the formation of source/drain regions in accordance with some embodiments of the present disclosure. The processes shown in FIGS. 12 through 16 correspond to the processes shown in FIGS. 4A, 4B-1 through 4B-5, 5A, and 5B-1 through 5B-3. Unless specified otherwise, the materials and the formation processes of the components in these embodiments are essentially the same as the like components, which are denoted by like reference numerals in the preceding embodiments. The details regarding the formation process and the materials of the components shown in FIGS. 12 through 16 may thus be found in the discussion of the preceding embodiments.

Figure 12:
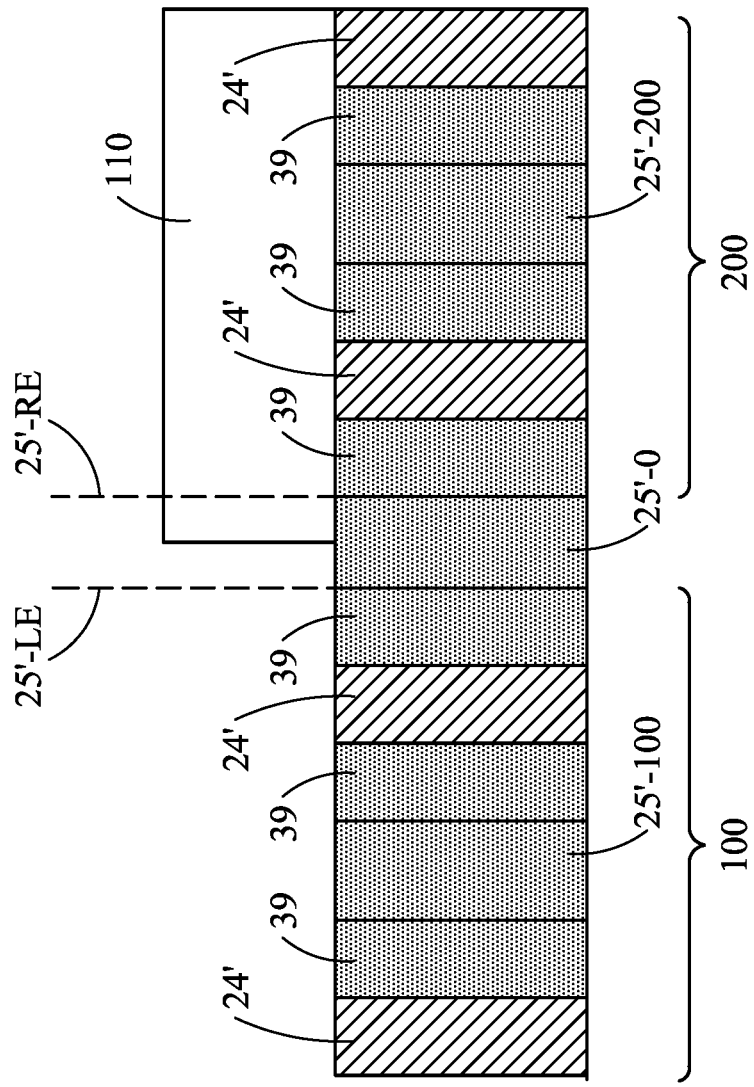
FIGS. 12 through 16 illustrate the perspective views and cross-sectional views of intermediate stages in the formation of FinFETs with source/drain regions separated by dummy fins in accordance with some embodiments.

The initial steps of these embodiments are essentially the same as shown in FIGS. 1, 2 and 3A. FIG. 12 illustrates a cross-section obtained from the cross-section 12-12 in FIG. 3A. It is appreciated that FIG. 12 illustrates more features than in FIG. 3A. For example, FIG. 12 illustrates device regions 100 and 200 divided by border dummy fin 25'-0 at the border. Three dummy fins 25' are illustrated, with border dummy fin 25'-0 dividing regions 100 and 200, and inner dummy fins 25'-100 and 25'-200 being inside device regions 100 and 200, respectively. Protruding fins 24' and fin spacers 39 are also illustrated schematically. Etching mask 110 is formed to cover the features in device region 200. Etching mask 110 may comprise photo resist in accordance with some embodiments, or may comprise a hard mask formed of TiN, BN, TaN, or the like. Device region 100 is exposed through the opening in etching mask 110. Etching mask 110 may cover an entirety or a part of dummy fin 25'-0, or does not cover dummy fin 25'-0. Accordingly, the left edge of etching mask 110 may be at any position between, and including, the left edge 25'-LE and the right edge 25'-RE of dummy fin 25'.

Figure 13:
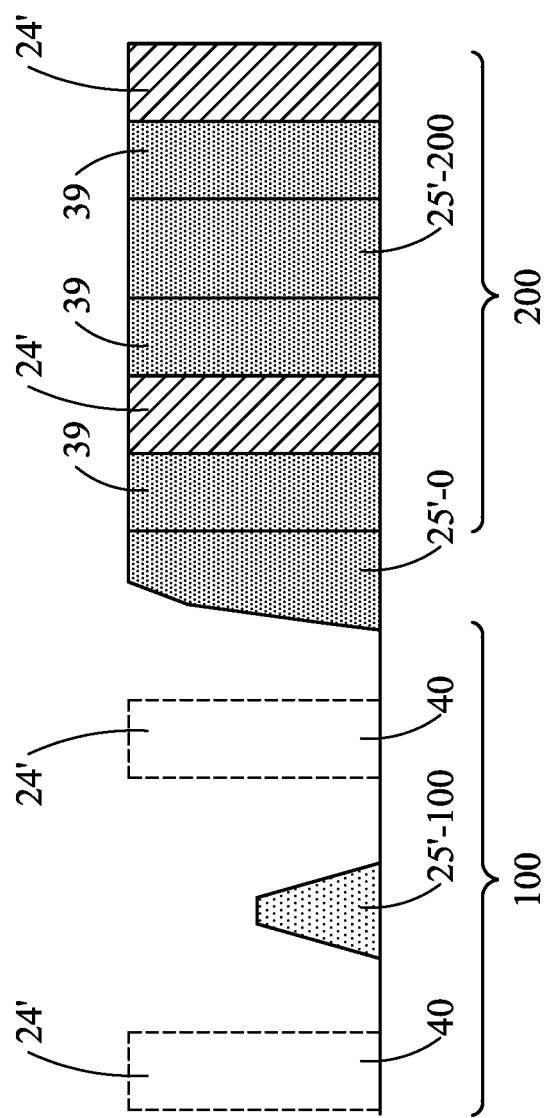

Next, an etching process(es) is performed to recess protruding fins 24' and dummy fin 25'-100. Fin spacers 39 may also be etched. The resulting structure is shown in FIG. 13. In FIG. 13, the portions of protruding fins 24' directly underlying dummy gate stacks 30 (FIG. 3A) are not recessed, and are shown as being dashed because these portions are in a different plane than illustrated. Recesses 40 are thus formed as the spaces left by the etched protruding fins 24'. Dummy fin 25'-0 may be, or may not be, etched substantially. The details of the etching process are discussed referring to FIG. 4A, and hence are not repeated herein. As a result of the etching process(es), dummy fin 25'-100 is lowered and narrowed. The sizes and the comparisons of the dimensions of dummy fin 25'-100 have been discussed in preceding paragraphs, and are not repeated herein. After the etching process, etching mask 110 may be removed when etching mask 110 comprises photo resist, or may be left and used as a mask for the subsequent epitaxy process. In these embodiments, etching mask 110 may be removed after the epitaxy process as shown in FIG. 14.

Figure 14:
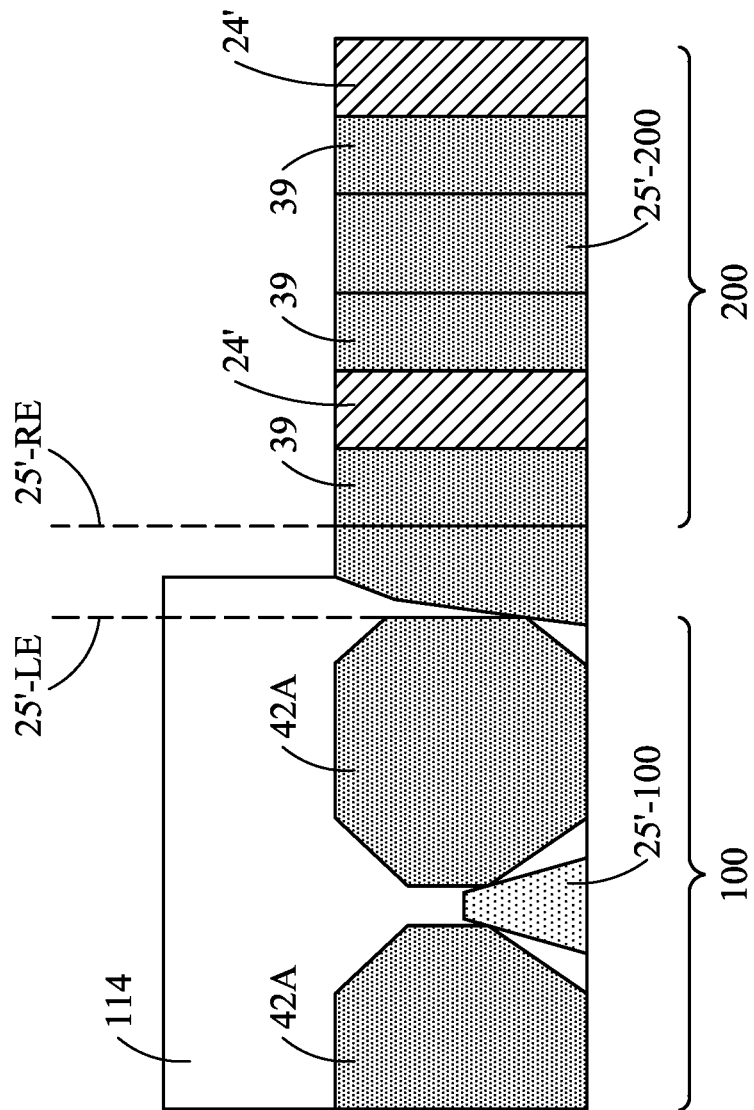

Referring to FIG. 14, source/drain regions 42A are formed in an epitaxy process. Next, etching mask 114 is formed to cover device region 100, and leaving device region 200 un-covered. The right edge of etching mask 114 may be at any position between, and including, the left edge 25'-LE and the right edge 25'-RE of dummy fin 25'.

Figure 15:
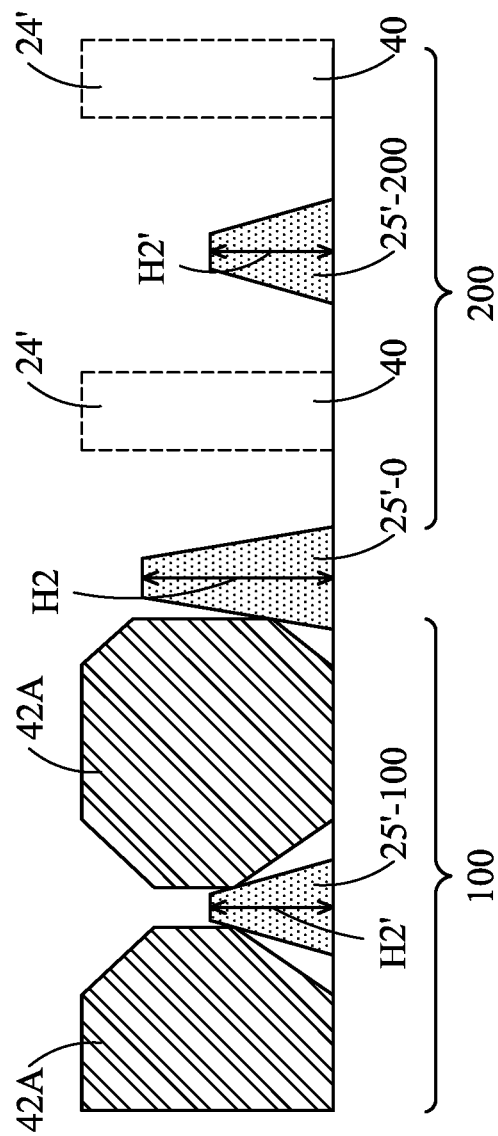

Next, an etching process is performed to recess protruding fins 24' and dummy fin 25'-200. The resulting structure is also shown in FIG. 15. Recesses 40 are thus formed as the spaces left by the etched protruding fins 24'. The details of the etching process are discussed referring to FIG. 4A, and hence are not repeated herein. As a result of the etching process, dummy fin 25'-200 is lowered and narrowed. Fin spacers 39 are also etched, and may be fully or partially removed. The sizes and the comparisons of the dimensions of dummy fin 25'-200 may be the same as discussed in preceding paragraphs, and are not repeated herein. After the etching process, etching mask 114 may be removed when etching mask 110 comprises photo resist, or may be left on in place, and removed after the epitaxy process as shown in FIG. 16.

Figure 16:
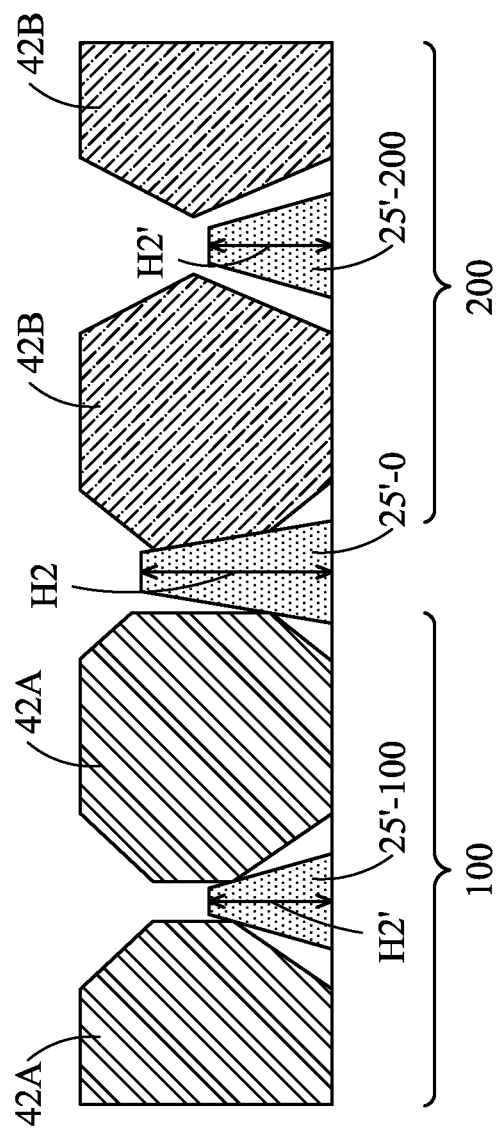

FIG. 16 illustrates the formation of source/drain regions 42B. Source/drain regions 42A have different profiles than source/drain regions 42B, and are asymmetric to source/drain regions 42B with relative to border dummy fin 25'-0. For example, the source/drain regions 42A and 42B are on opposing sides of and immediately neighboring border dummy fin 25'-0 may have different sizes, different shapes, different conductivity types, and/or different materials.

Referring to FIG. 12, the left edge of etching mask 110 may be at any position between, and including, the left edge 25'-LE and the right edge 25'-RE of dummy fin 25'. Referring to FIG. 14, the right edge of etching mask 114 may be at any position between, and including, the left edge 25'-LE and the right edge 25'-RE of dummy fin 25'. Accordingly, etching masks 110 and 114 may overlap and cover a part of or an entirety of dummy fin 25'-0. Alternatively, a part or an entirety of dummy fin 25'-0 may not be covered by either or both of etching masks 110 and 114. These variations result in the border dummy fin 25'-0 to have different profiles and heights as selected. In accordance with some embodiments, border dummy fin 25'-0 is higher than inner dummy fins 25'-100 and 25'-200, for example, with the height ratio H2/H2' (with heights H2 and H2' shown in FIG. 16) being greater than 1.1, greater than 1.5, or greater than 2.0.

Figure 17:
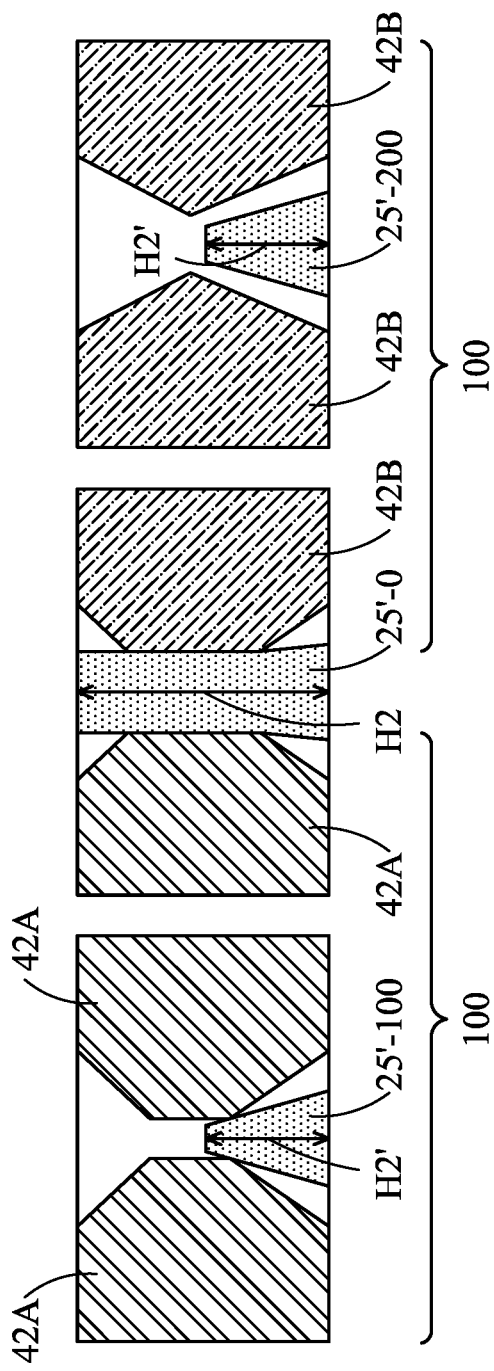
FIGS. 17 and 18 illustrate the dummy fins and source/drain regions on opposing sides of the dummy fins in accordance with some embodiments.

FIG. 17 illustrates the profiles of dummy fins 25'-0, 25'-100, and 25'-200 in accordance with some embodiments. Dummy fin 25'-0 may have a height greater than both of dummy fins 25'-100 and 25'-200. With dummy fin 25'-0 being high, there is a higher process window for growing source/drain regions 42A and 42B without the concern of merging source/drain region 42A to source/drain region 42B. On the other hand, since the source/drain regions 42A on the opposing sides of dummy fin 25'-100 are symmetric to each other, the process is easier to control, and hence dummy fin 25'-100 may be made smaller (with height H2' being smaller than height H2) to increase the volume of source/drain regions 42A. Similarly, since the source/drain regions 42B on the opposing sides of dummy fin 25'-200 are symmetric to each other, the process is easier to control, and hence dummy fin 25'-200 may be made smaller to increase the volume of source/drain regions 42B. FIG. 17 illustrates an example in which the left part and the right part of dummy fin 25'-0 are symmetric to each other.

Figure 18:
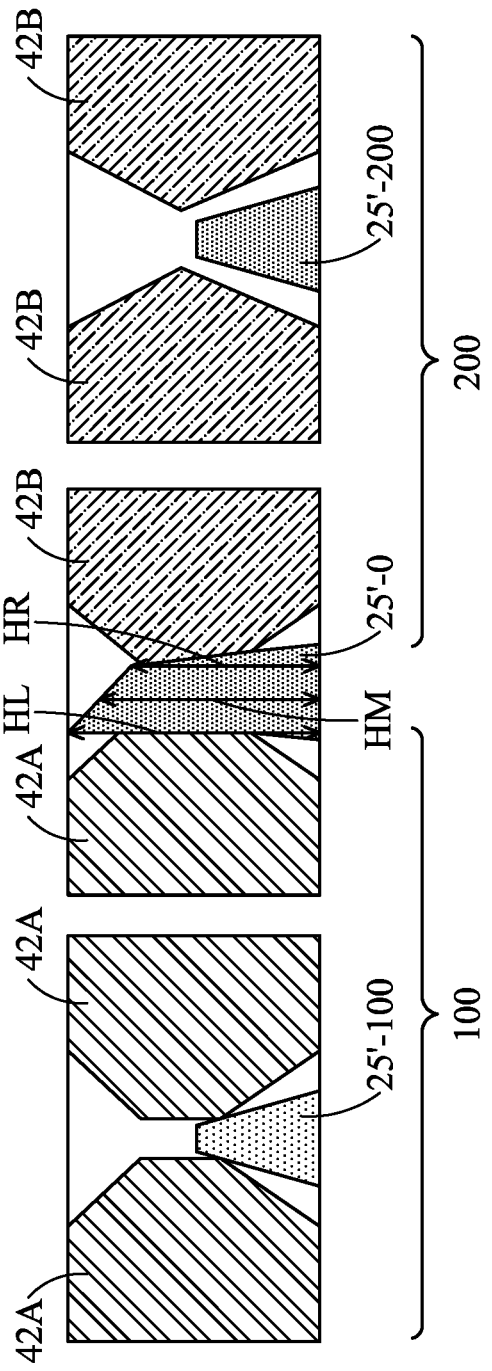

FIG. 18 illustrates the profiles of dummy fins 25'-0, 25'-100, and 25'-200 in accordance with alternative embodiments. These embodiments are similar to the embodiments as shown in FIG. 17, except that the left part and the right part of dummy fin 25'-0 are asymmetric to each other. For example, the height HL of the left part may be greater than the height HR of the right part, and each of heights HL and HR may be equal to or different from middle height HM.

The embodiments of the present disclosure have some advantageous features. By recessing dummy fins, more spaces are available for forming source/drain regions with greater volume. The increase in the volume of the source/drain regions results in the improvement in the performance of the resulting FinFETs.

In accordance with some embodiments of the present disclosure, a method includes forming a first protruding semiconductor fin and a dummy fin protruding higher than top surfaces of isolation regions, wherein the first protruding semiconductor fin is parallel to the dummy fin; forming a gate stack on a first portion of the first protruding semiconductor fin and a second portion of the dummy fin; recessing a third portion of the first protruding semiconductor fin to form a recess; recessing an fourth portion of the dummy fin to reduce a height of the fourth portion of the dummy fin; and forming an epitaxy semiconductor region in the recess, wherein the epitaxy semiconductor region is grown toward the dummy fin. In an embodiment, the epitaxy semiconductor region is blocked by the dummy fin that has been recessed. In an embodiment, the recessing the third portion of the first protruding semiconductor fin and the recessing the fourth portion of the dummy fin are performed in a common etching process. In an embodiment, when the fourth portion of the dummy fin is recessed, the second portion of the dummy fin directly underlying the gate stack is protected from being etched. In an embodiment, the recessing the third portion of the first protruding semiconductor fin and the recessing the fourth portion of the dummy fin are performed in different etching processes. In an embodiment, the height of the fourth portion of the dummy fin is reduced more than 30 percent and less than about 70 percent.

In accordance with some embodiments of the present disclosure, a device includes isolation regions on a semiconductor substrate; a first protruding semiconductor fin protruding higher than top surfaces of the isolation regions; a semiconductor region connecting to an end of the first protruding semiconductor fin; and a first dummy fin protruding higher than the top surfaces of the isolation regions, wherein the first dummy fin comprises a first portion having a first height; and a second portion having a second height smaller than the first height, wherein the semiconductor region expands laterally toward the second portion of the first dummy fin. In an embodiment, the device further comprises a first gate stack on the first protruding semiconductor fin; and a gate isolation region contacting a sidewall of the first gate stack, wherein the gate isolation region is over and contacting the first portion of the first dummy fin. In an embodiment, the device further comprises a second protruding semiconductor fin protruding higher than the top surfaces of the isolation regions; and a second gate stack on the second protruding semiconductor fin, wherein the second gate stack is separated from the first gate stack by the gate isolation region. In an embodiment, the semiconductor region contacts a sidewall of the second portion of the first dummy fin. In an embodiment, a ratio of the second height to the first height is in a range between about 0.3 and about 0.7. In an embodiment, the first portion of the first dummy fin has a first bottom width and a first top width equal to the first bottom width, and wherein the second portion of the first dummy fin has a second bottom width and a second top width smaller than the second bottom width. In an embodiment, the device further comprises a second dummy fin protruding higher than the top surfaces of the isolation regions, wherein the second dummy fin further comprises a third portion and a fourth portion, wherein the fourth portion of the second dummy fin and the second portion of the first dummy fin are on opposing sides of the semiconductor region, and the second height of the second portion of the first dummy fin is greater than a third height of the fourth portion of the second dummy fin. In an embodiment, the first dummy fin and the second dummy fin are parallel to each other.

In accordance with some embodiments of the present disclosure, a device comprises isolation regions on a semiconductor substrate; a dummy fin protruding higher than a top surface of the isolation regions, wherein the dummy fin comprises a first portion having a first height; and a second portion having a second height smaller than the first height; and a first source/drain region and a second source/drain region contacting opposing sidewalls of the second portion of the dummy fin. In an embodiment, the device further comprises a first FinFET comprising a first protruding semiconductor fin and the first source/drain region; and a second FinFET comprising a second protruding semiconductor fin on an opposite side of the dummy fin than the first protruding semiconductor fin, wherein the second FinFET comprises the second source/drain region. In an embodiment, the first FinFET and the second FinFET are of opposite conductivity types. In an embodiment, the first FinFET and the second FinFET are of a same conductivity type. In an embodiment, the second height is less than about 90 percent of the first height.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a semiconductor substrate;
isolation regions in the semiconductor substrate;
a protruding semiconductor fin higher than top surfaces of the isolation regions;
a gate stack on the protruding semiconductor fin;
a gate spacer on a sidewall of the gate stack, wherein the gate spacer contacts the sidewall of the gate stack to form a vertical interface;
a semiconductor region connecting to an end of the protruding semiconductor fin;
a contact etch stop layer over the semiconductor region;
an inter-layer dielectric over the contact etch stop layer; and
a dummy fin comprising:
a first portion directly underlying the gate stack and the gate spacer, wherein a sidewall of the first portion contacts a portion of the contact etch stop layer, and wherein the sidewall of the first portion of the dummy fin is in a vertical plane that is parallel to the vertical interface; and
a second portion overlapped by the contact etch stop layer.

2. The device of claim 1, wherein the protruding semiconductor fin has a first height, and the second portion of the dummy fin has a second height smaller than the first height.

3. The device of claim 1, wherein the dummy fin comprises a dielectric material.

4. The device of claim 1, wherein the second portion of the dummy fin comprises:
a lower portion comprising a first sidewall; and
an upper portion narrower than the lower portion, wherein the upper portion comprises a second sidewall tilted more than the first sidewall.

5. The device of claim 4 further comprising a fin spacer comprising a third sidewall contacting the first sidewall.

6. The device of claim 5, wherein a top end of the fin spacer is lower than the upper portion of the dummy fin.

7. The device of claim 1, wherein the dummy fin comprises a first straight sidewall and a second straight sidewall opposing each other, and wherein the first straight sidewall is more vertical than the second straight sidewall.

8. The device of claim 1, wherein the sidewall of the first portion of the dummy fin contacts a portion of the contact etch stop layer to form a substantially vertical interface.

9. The device of claim 1, wherein the dummy fin is higher than the top surfaces of the isolation regions.

10. The device of claim 1, wherein the dummy fin is comprised in a dielectric region, and the dielectric region comprises a first portion lower than the top surfaces of the isolation regions, and a second part as the dummy fin.

11. The device of claim 1, wherein a first top surface of the protruding semiconductor fin is substantially leveled with a second top surface of the first portion of the dummy fin.

12. The device of claim 1 further comprising a gate isolation region over and contacting the first portion of the dummy fin.

13. A device comprising:
a semiconductor substrate;
isolation regions contacting the semiconductor substrate;
a semiconductor fin higher than the isolation regions;
a gate stack over the semiconductor fin;
a gate spacer comprising a first sidewall contacting the gate stack, and a second sidewall opposing and parallel to the first sidewall;
a dummy fin higher than the isolation regions, wherein the dummy fin comprises:
a first portion comprising a first top surface;
a second portion comprising a second top surface lower than the first top surface; and
a third sidewall connecting the first top surface to the second top surface to form a step, wherein the third sidewall is vertically aligned to the second sidewall;
a contact etch stop layer contacting the third sidewall of the dummy fin and the second top surface of the dummy fin; and
a first source/drain region and a second source/drain region contacting opposing sidewalls of the second portion of the dummy fin.

14. The device of claim 13, wherein the contact etch stop layer further contacts the first source/drain region and the second source/drain region.

15. The device of claim 13 further comprising a fin spacer contacting the second portion of the dummy fin.

16. The device of claim 13, wherein the third sidewall of the dummy fin and the second sidewall of the gate spacer are in a same vertical plane.

17. A device comprising:
a semiconductor substrate;
isolation regions contacting the semiconductor substrate;
a semiconductor fin protruding higher than the isolation regions, wherein the semiconductor fin comprises a first top surface;
a gate stack on the semiconductor fin;
a gate spacer comprising an inner sidewall contacting the gate stack to form a first vertical interface, and an outer sidewall opposing the inner sidewall;
a dummy fin protruding higher than the isolation regions, wherein the dummy fin comprises:
 a first portion directly underlying the gate stack, wherein both of a first end of the first portion and the outer sidewall of the gate spacer are in a first vertical plane; and
 a second portion vertically misaligned from the gate stack, wherein the second portion comprising a second top surface lower than the first top surface; and
a first source/drain region and a second source/drain region on opposite sides of the second portion of the dummy fin.

18. The device of claim 17 further comprising:
a contact etch stop layer; and
an inter-layer dielectric on the contact etch stop layer, wherein the contact etch stop layer and the inter-layer dielectric comprise portions between the first source/drain region and the dummy fin.

19. The device of claim 18, wherein the contact etch stop layer physically contacts:
a sidewall of the first portion of the dummy fin to form a second vertical interface, wherein the second vertical interface is in a second vertical plane that is parallel to the first vertical plane; and
a top surface of the second portion of the dummy fin.

20. The device of claim 19, wherein the first vertical plane and the second vertical plane are a same vertical plane.

* * * * *